US012244129B2

(12) United States Patent
Shurte et al.

(10) Patent No.: US 12,244,129 B2
(45) Date of Patent: Mar. 4, 2025

(54) SMART WALL-PLATE SYSTEM

(71) Applicant: Leviton Manufacturing Co., Inc., Melville, NY (US)

(72) Inventors: James Shurte, New Orleans, LA (US); Ronald J. Gumina, Mandeville, LA (US); Aaron Ard, Ponchatoula, LA (US); Carlos Salazar, North Babylon, NY (US); Ryan L. Arbour, New Orleans, LA (US); Jason Gillard, Mandeville, LA (US)

(73) Assignee: Leviton Manufacturing Co., Inc., Melville, NY (US)

( * ) Notice: Subject to any disclaimer, the term of this patent is extended or adjusted under 35 U.S.C. 154(b) by 145 days.

(21) Appl. No.: 17/778,535

(22) PCT Filed: Nov. 3, 2020

(86) PCT No.: PCT/US2020/058642
§ 371 (c)(1),
(2) Date: May 20, 2022

(87) PCT Pub. No.: WO2021/133467
PCT Pub. Date: Jul. 1, 2021

(65) Prior Publication Data
US 2022/0416526 A1    Dec. 29, 2022

Related U.S. Application Data

(60) Provisional application No. 62/953,269, filed on Dec. 24, 2019.

(51) Int. Cl.
*H05K 5/02* (2006.01)
*H02G 3/08* (2006.01)
*H05K 7/14* (2006.01)

(52) U.S. Cl.
CPC .......... *H02G 3/081* (2013.01); *H05K 5/0217* (2013.01); *H05K 7/1427* (2013.01)

(58) Field of Classification Search
CPC .................................................. H05K 5/0217
(Continued)

(56) References Cited

U.S. PATENT DOCUMENTS

| 3,958,869 A | 5/1976 | Beck |
| 4,514,789 A | 4/1985 | Jester |

(Continued)

FOREIGN PATENT DOCUMENTS

| CN | 211088619 U | 7/2020 |
| DE | 102011088653 | 6/2013 |

(Continued)

OTHER PUBLICATIONS

Author Unknown., "The Anywhere Switch/Switch Kit" Leviton Mfg. Co., Inc. 2013, 2 pages.

(Continued)

*Primary Examiner* — Hung S. Bui
(74) *Attorney, Agent, or Firm* — KDW FIRM PLLC

(57) ABSTRACT

A wall-plate system having a wall-plate adapted to accommodate a printed circuit board assembly (PCBA) coupled with the wall-plate and may comprise a mounting bracket. The PCBA may include one or more chip packages and/or other components that extend into cavities in the mounting bracket after installation, the cavities located on the mounting bracket to accommodate chip packages and/or other components. The wall-plate may include snaps to couple with the mounting bracket, the snaps extending from an interior surface of the wall-plate, the snaps located away from edges of the wall-plate towards a center of the wall-plate. The mounting bracket may comprise openings to couple with a device in a junction box and/or with the (Continued)

junction box. The wall-plate may comprise, e.g., one or more battery mounts and the mounting bracket may have a shape to accommodate extension by the battery mounts into a plane of the mounting bracket.

29 Claims, 14 Drawing Sheets

(58) Field of Classification Search
USPC ........................................................ 361/752
See application file for complete search history.

(56) References Cited

U.S. PATENT DOCUMENTS

| | | |
|---|---|---|
| 4,654,745 A | 3/1987 | Corby |
| 4,939,792 A | 7/1990 | Urbish et al. |
| D310,814 S | 9/1990 | Rosenbaum et al. |
| D310,815 S | 9/1990 | Watson et al. |
| D312,611 S | 12/1990 | Watson et al. |
| 5,079,559 A | 1/1992 | Umetsu et al. |
| 5,130,893 A * | 7/1992 | Straate ................. H05K 7/1439 361/728 |
| 5,206,657 A | 4/1993 | Downey |
| 5,239,205 A | 8/1993 | Hoffman et al. |
| 5,336,979 A | 8/1994 | Watson et al. |
| 5,340,954 A | 8/1994 | Hoffman et al. |
| 5,436,421 A | 7/1995 | Sadowski |
| 5,485,058 A | 1/1996 | Watson et al. |
| D369,143 S | 4/1996 | Sorenson |
| 5,565,855 A | 10/1996 | Knibbe |
| 5,570,085 A | 10/1996 | Bertsch |
| 5,621,283 A | 4/1997 | Watson et al. |
| 5,637,964 A | 6/1997 | Hakkarainen et al. |
| 5,663,862 A | 9/1997 | Hopping-Mills |
| 5,703,329 A | 12/1997 | Delone |
| D389,461 S | 1/1998 | Mayo et al. |
| D389,805 S | 1/1998 | Mayo et al. |
| D391,924 S | 3/1998 | Mayo et al. |
| 5,736,965 A | 4/1998 | Mosebrook et al. |
| D395,037 S | 6/1998 | Mayo et al. |
| 5,818,128 A | 10/1998 | Hoffman et al. |
| 5,838,226 A | 11/1998 | Houggy et al. |
| 5,842,032 A | 11/1998 | Bertsch |
| 5,844,516 A | 12/1998 | Viljanen |
| 5,848,054 A | 12/1998 | Mosebrook et al. |
| 5,938,757 A | 8/1999 | Bertsch |
| D416,871 S | 11/1999 | Todd |
| 5,982,103 A | 11/1999 | Mosebrook et al. |
| 6,011,226 A | 1/2000 | Sadowski et al. |
| 6,013,885 A | 1/2000 | Kowalczyk |
| 6,169,377 B1 | 1/2001 | Bryde et al. |
| 6,326,754 B1 | 12/2001 | Mullet et al. |
| 6,397,288 B1 | 5/2002 | Rye et al. |
| 6,423,900 B1 | 7/2002 | Soules |
| 8,340,975 B1 | 12/2012 | Rosenberger |
| 9,401,252 B2 | 7/2016 | Keirstead |
| 9,589,461 B1 | 3/2017 | Byrne |
| 9,818,559 B2 | 11/2017 | Tress |
| 9,860,965 B2 | 1/2018 | Recker |
| 9,911,372 B2 | 3/2018 | Dimberg |
| 9,978,547 B1 | 5/2018 | Wisniewski et al. |
| 10,314,148 B2 | 6/2019 | Kare |
| 10,386,891 B2 | 8/2019 | Allen et al. |
| 10,475,596 B2 | 11/2019 | Dimberg |
| 10,733,988 B2 | 8/2020 | Cook |
| 10,852,771 B2 | 12/2020 | Allen et al. |
| 10,965,068 B1 * | 3/2021 | King ..................... H05B 47/19 |
| 2003/0075351 A1 | 4/2003 | Chang |
| 2004/0202343 A1 | 10/2004 | Rye et al. |
| 2005/0043907 A1 | 2/2005 | Eckel |
| 2008/0001549 A1 | 1/2008 | Altonen et al. |
| 2011/0129097 A1 | 6/2011 | Andrea |
| 2012/0129372 A1 | 5/2012 | Le Page |
| 2013/0257315 A1 | 10/2013 | Restrepo et al. |
| 2014/0246218 A1 | 9/2014 | Shotey |
| 2014/0262848 A1 | 9/2014 | Fathollahi et al. |
| 2014/0353130 A1 | 12/2014 | Sekikawa |
| 2015/0078555 A1 | 3/2015 | Zhang et al. |
| 2015/0156598 A1 | 6/2015 | Sun et al. |
| 2015/0215747 A1 | 7/2015 | Kemmerer, Jr. et al. |
| 2015/0256355 A1 | 9/2015 | Pera et al. |
| 2015/0341072 A1 | 11/2015 | Lai et al. |
| 2016/0110154 A1 | 4/2016 | Qureshi et al. |
| 2016/0111837 A1 | 4/2016 | Misener |
| 2016/0133893 A1 * | 5/2016 | Chong ................. H01M 50/216 429/100 |
| 2016/0219682 A1 | 7/2016 | Altonen et al. |
| 2016/0353547 A1 * | 12/2016 | Shivell ................. H05B 47/11 |
| 2016/0363143 A1 | 12/2016 | Druce et al. |
| 2017/0027043 A1 | 1/2017 | Greene et al. |
| 2017/0188437 A1 | 6/2017 | Banta |
| 2017/0208657 A1 | 7/2017 | Jensen |
| 2017/0271921 A1 | 9/2017 | Lombardi et al. |
| 2018/0054688 A1 | 2/2018 | Cartwright et al. |
| 2018/0063249 A1 | 3/2018 | Nguyen |
| 2018/0084627 A1 | 3/2018 | Recker et al. |
| 2018/0124903 A1 | 5/2018 | Strods et al. |
| 2018/0145844 A1 | 5/2018 | Pera et al. |
| 2018/0168332 A1 * | 6/2018 | Wagner ................. A61C 1/088 |
| 2018/0211656 A1 | 7/2018 | Chong et al. |
| 2018/0228006 A1 | 8/2018 | Baker et al. |
| 2018/0302235 A1 | 10/2018 | Cregg et al. |
| 2018/0375308 A1 | 12/2018 | Rohmer |
| 2019/0027875 A1 | 1/2019 | Parks |
| 2019/0124752 A1 | 4/2019 | Kelly |
| 2019/0130707 A1 | 5/2019 | Gruber |
| 2019/0228923 A1 | 7/2019 | Li |
| 2020/0037422 A1 | 1/2020 | Shivell |
| 2020/0170139 A1 | 5/2020 | Horning |
| 2021/0028954 A1 | 1/2021 | Ard et al. |

FOREIGN PATENT DOCUMENTS

| | | |
|---|---|---|
| WO | 2012093412 A1 | 7/2012 |
| WO | 2012094722 A1 | 7/2012 |
| WO | 2015184193 A1 | 12/2015 |
| WO | 2018148315 A1 | 8/2018 |
| WO | 2019084391 | 5/2019 |
| WO | 2021133467 A1 | 7/2021 |

OTHER PUBLICATIONS

Author Unknown., "Seco-Larm SD-7202GC-PEQ Enforcer LED Illuminated RTE Single-gang Wall Plate with Large Green Button, Large Illuminated Push Button with Caption "Push to Exit", Pushbutton Rated 10A at 125 to 250VAC" Seco-Larm®—retrieved May 7, 2019—URL: https://www.amazon.com/Seco-Larm-SD-7202GC-PEQ-Illuminated-Single-gang-Pushbutton/dp/B0051BUGCA/ref=sr_1_1?crid=3DJETQGDS3II8&keywords=seco-larm%2Bsd-7202gc-peq&qid=1653064565&sprefix=-larm%2BSD-7%2Caps%2C98&sr=8-1&th=1.

International Search Report and Written Opinion for the International Patent Application No. PCT/US21/71739, mailed Jan. 27, 2022, 16 pages.

International Search Report and Written Opinion for the International Patent Application No. PCT/US2020/036765, dated Aug. 28, 2020, 14 pages.

U.S. Appl. No. 62/455,973 Specification, Claims, Abstract, Drawings with Filing Receipt, filed Feb. 7, 2017, 42 pages.

"Ecobee_Switch+_ecobee_Smart_Home_Technology2-website_ ecobee", https://www.ecobee.com/switch-plus/ , downloaded on May 23, 2018.

Ecobee is building Alexa into its theromstats and light switches, https://techcrunch.com/2017/05/03/ecobee-is-building-alexa-into-its-thermostats-and-light-switches/.

Petchel, Megan., "iDevices and Hubbell Incorporated Debut First Co-Developed Technology Products at the 2018 Consumer Electronics Show (CES)" iDevices Blog, Jan. 9, 2018.

(56) References Cited

OTHER PUBLICATIONS

International Search Report and Written Opinion for the International Patent Application No. PCT/US2018/059333, dated Jan. 18, 2019, 17 pages.
International Search Report and Written Opinion for the International Application No. PCT/US23/13599, mailed Jun. 16, 2023, 18 pages.
International Search Report and Written Opinion dated Mar. 26, 2021, in corresponding PCT Application PCT/US20/58642.
Author Unknown., "Seco-Larm SD-7202GC-PEQ Enforcer LED Illuminated RTE Single-gang Wall Plate with Large Green Button, Large Illuminated Push Button with Caption "Push to Exit", Pushbutton Rated 10A at 125 to 250VAC" Seco-Larm®—retrieved May 20, 2022—URL: https://www.amazon.com/Seco-Larm-SD-7202GC-PEQ-Illuminated-Single-gang-Pushbutton/dp/B0051BUGCA/ref=sr_1_1?crid=3DJETQGDS3II8&keywords=seco-larm%2Bsd-7202gc-peq&qid=1653064565&sprefix=-larm%2BSD-7%2Caps%2C98&sr=8-1&th=1.

* cited by examiner

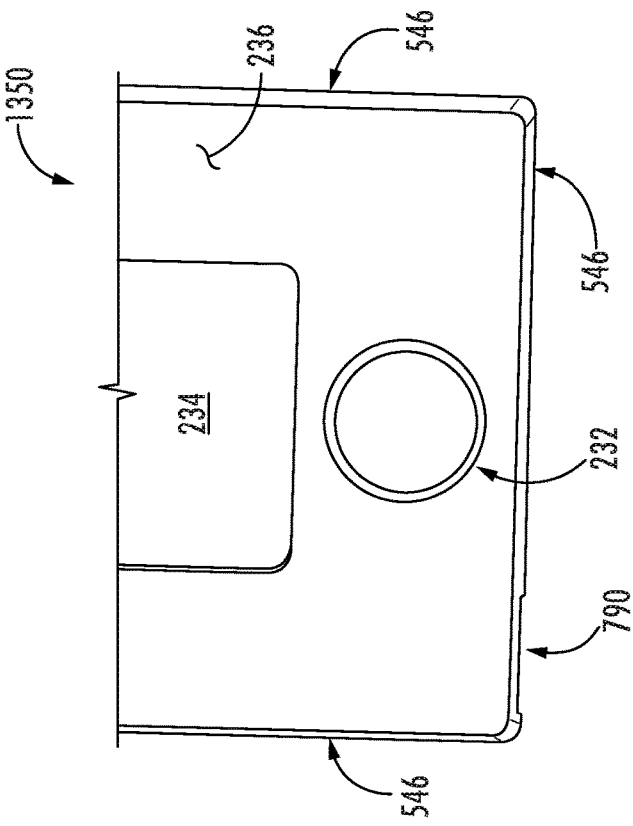
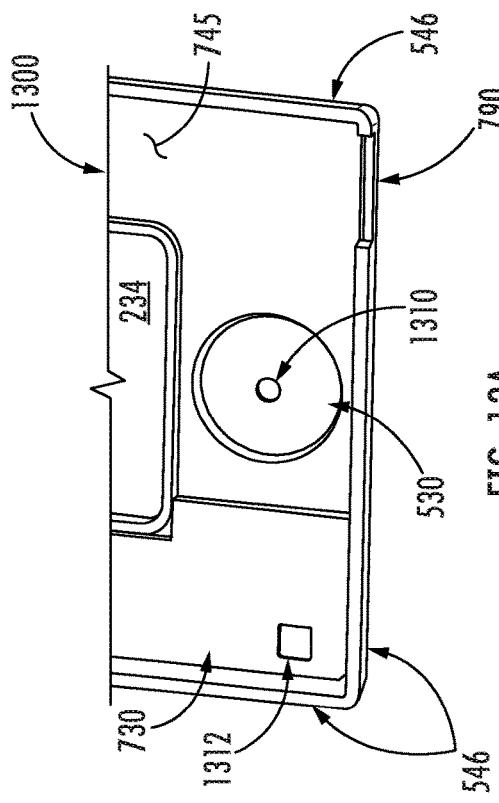
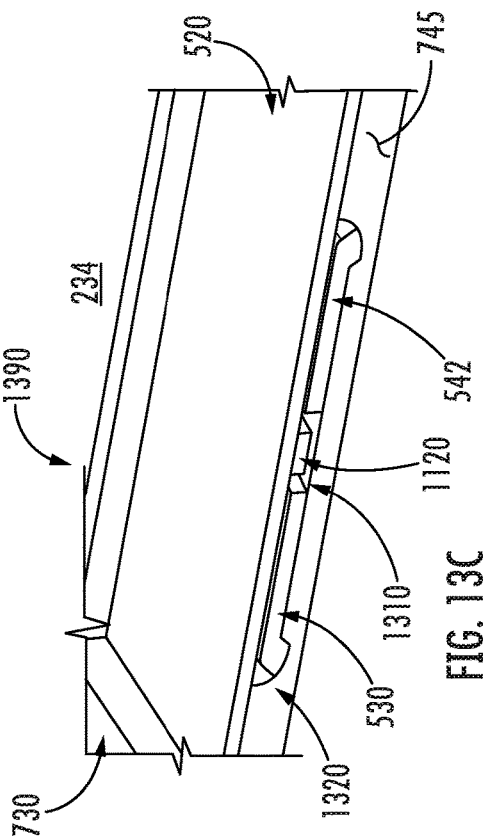
FIG. 13A
FIG. 13B
FIG. 13C

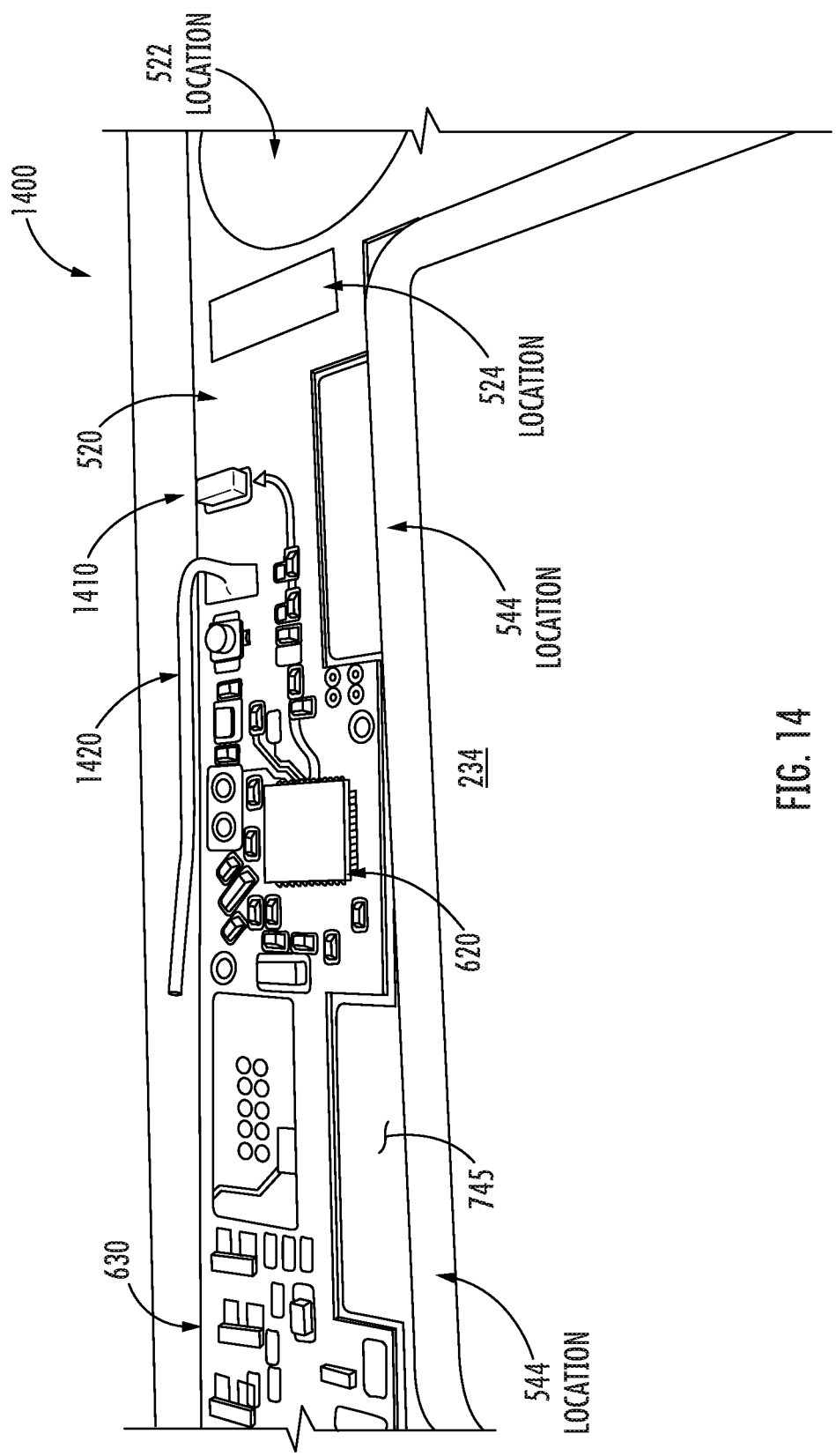

SMART WALL-PLATE SYSTEM

CROSS-REFERENCE TO RELATED APPLICATIONS

This application is a United States National Phase filing of International Application No. PCT/US2020/058642, filed Nov. 3, 2020, which is a non-provisional of, and claims the benefit of the filing date of, U.S. provisional patent application No. 62/953,269, filed Dec. 24, 2019, entitled "Smart Wall-plate System", the entirety of each application is incorporated by reference herein.

FIELD OF THE DISCLOSURE

The present disclosure relates generally to a wall-plate, more particularly, to a smart wall-plate system having customizable device controls.

BACKGROUND OF THE DISCLOSURE

In-wall devices may include devices such as switches and outlets. Switches may include an in-wall load control device such as a toggle/paddle switch, a dimmer switch, etc. and can be used to control one or more loads such as a lighting load or a motor load such as a fan. Outlets may include, e.g., electrical power outlets, data cable outlets, satellite/cable television outlets, security video outlets, adapters, splitters, transformers, etc. Typically, each in-wall device includes a conventional wall-plate. Conventional wall-plates are essentially decorative and provide no function other than to aesthetically cover any holes within a wall used to install the in-wall device. As spaces begin to include more smart devices such as Internet of Things (IoT) devices that can be controlled wirelessly, additional convenient control surfaces are needed throughout a space to provide interfaces for controlling the smart devices. While conventional wall-plates are often found throughout spaces in accessible locations, conventional wall-plate surfaces are very limited in functionality.

Thus, it would be desirable to provide smart devices within a space that has traditionally remained unutilized.

SUMMARY OF THE INVENTION

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

The present disclosure is directed to a smart wall-plate system having customizable device controls to initiate automations including functions, routines, actions, activities, or controls (used interchangeably herein without the intent to limit) to be performed by a single device or a variety of local and/or remote devices. The smart wall-plate system may comprise a wall-plate adapted to accommodate a printed circuit board assembly (PCBA) coupled with the wall-plate and may, in some embodiments, also include a mounting bracket. The PCBA may include one or more chip packages and/or other components that extend into cavities in the mounting bracket after installation. The chip packages may comprise, for example, one or more integrated circuits mounted inside a package with inputs and outputs accessible via pins, prongs, pads, and/or the like. Other components may comprise diodes, transistors, resistors, capacitors, other integrated circuits, printed circuit boards, battery mounts, antennas, and/or the like. The cavities may be located on the mounting bracket to accommodate the chip packages and/or other components. The wall-plate may include snaps to couple with the mounting bracket, the snaps extending from an interior (second) surface of the wall-plate. The snaps may be located away from edges of the wall-plate towards a center of the wall-plate.

The mounting bracket may comprise openings to couple the mounting bracket with a device in a junction box and/or to couple with the junction box. The wall-plate may comprise, e.g., one or more battery mounts and the mounting bracket may have a shape to accommodate extension by the battery mounts into a plane of the mounting bracket. Further embodiments may include power connectors to connect to one or more alternative or additional power sources.

BRIEF DESCRIPTION OF THE DRAWINGS

By way of example, specific embodiments of the disclosed device will now be described, with reference to the accompanying drawings, in which:

FIGS. 13A-C depicts an embodiment of a light ring to diffuse light from an LED inserted through an opening in the light ring, and a depression in which to seat the light ring; and FIG. 14 illustrates an embodiment of a wall-plate with a wire antenna and an antenna array in a chip package.

DETAILED DESCRIPTION

Figure 1:
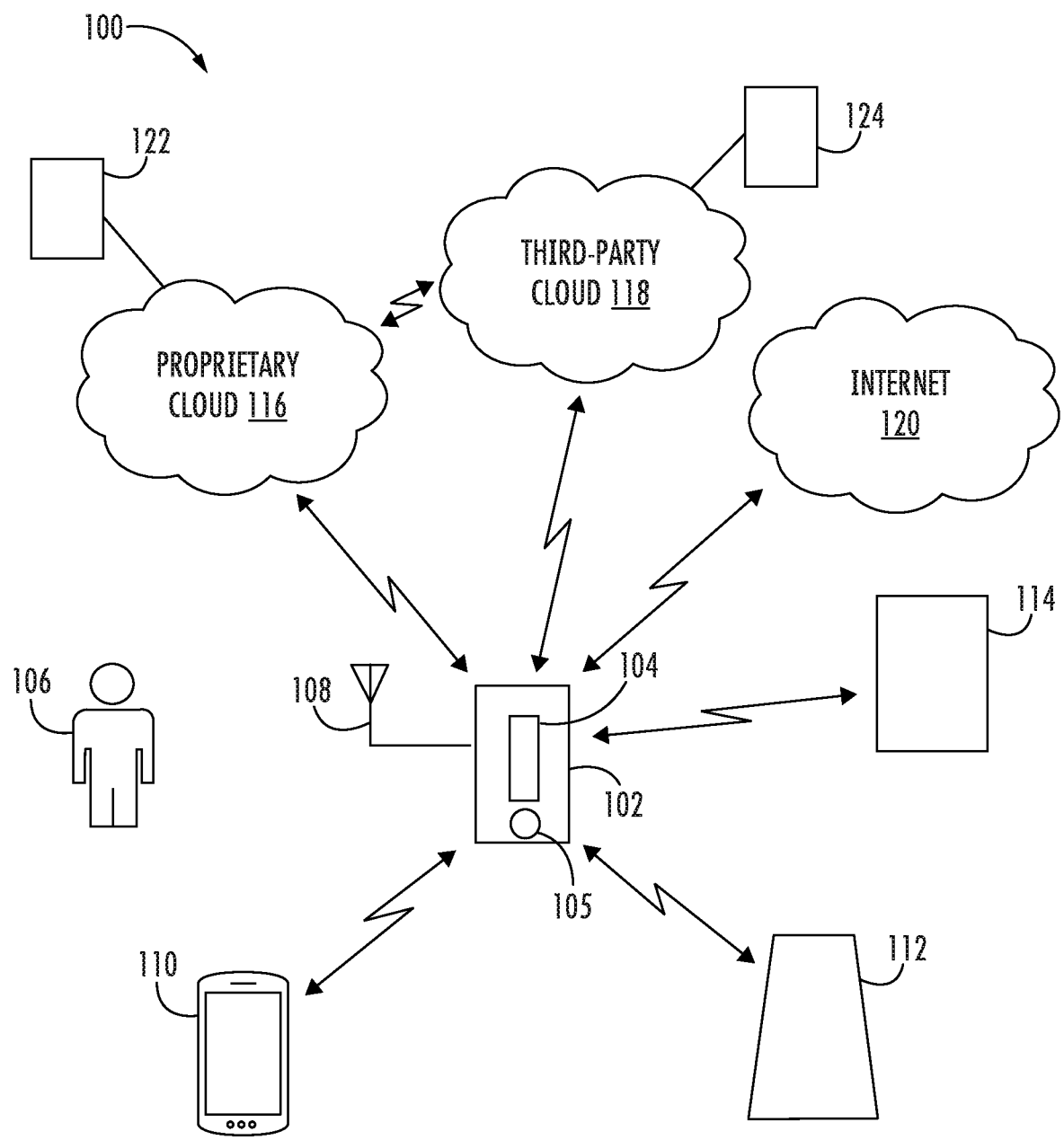
FIG. 1 illustrates an operating environment for a smart wall-plate system.

Devices, systems, and methods in accordance with the present disclosure will now be described more fully hereinafter with reference to the accompanying drawings, in which preferred embodiments of the devices, systems, and methods are shown. The disclosed devices, systems, and method, however, may be embodied in many different forms and should not be construed as being limited to the embodiments set forth herein. Rather, these embodiments are provided so that this disclosure will be thorough and complete, and will fully convey the scope of the devices, systems, and methods to those skilled in the art. In the drawings, like numbers refer to like elements throughout.

FIG. 1 illustrates an operating environment 100 for a smart wall-plate system also referred to as a wall-plate system 102. The wall-plate system 102 may provide customizable control of a variety of local and/or remote devices through a user interface provided on a surface positioned around an opening for an in-wall device 104. In some embodiments, the in-wall device 104 may be an electrical device such as, for example, a load control device such as, for example, a paddle switch, a toggle switch, a dimmer switch, a slide switch, a rocker switch, a push button, a capacitive touch switch, a touchscreen, etc. For example, the in-wall device 104 may be a light switch that may be coupled to any type of load such as, for example, a lighting load, a power receptacle, or a motor load such as a Fan.

In other embodiments, the in-wall device 104 may be a light fixture, a lighting device, an electrical receptacle or outlet, a blank, a sensor, a nightlight, an audio outlet, a data outlet, a phone line outlet, a breaker, etc. While in-wall devices, such as the in-wall device 104, may be described and illustrated in some embodiments herein as load control devices, embodiments are not so limited. The in-wall devices discussed herein can be any now known or hereafter developed in-wall device.

The operating environment 100 illustrates some of the types of devices, services, platforms, and/or networking components to which the wall-plate system 102 may connect, either directly or indirectly. A direct connection or link, for instance, may comprise a direct wireless link or channel between the wall-plate system 102 and another device such as a computing device 110 or a local device 112. The direct connection or link is possible when devices are within wireless communication range of one another. An indirect connection or link, for instance, may involve a wireless link via a relay device such as a wireless router, wireless switch, or wireless hub. An indirect connection or link, for example, may also involve communication with a controller to cause the controller to issue instructions to other devices wired to the controller or wirelessly connected to the controller.

The operating environment 100 may represent multiple networks such as ad hoc networks between local devices such as devices 102 110, 112, and 114 within wireless communication range, a local area network (LAN) with an access point to manage devices on the LAN and establish communications between devices within the wireless communication range of the access point, an Internet 120 to provide remote access between local networks and other networks coupled with the Internet 120, and one or more remote networks represented by the proprietary cloud 116 and remote device 122 as well as the third-party cloud 118 and remote device 124.

The wall-plate system 102 and portions of the operating environment 100 may reside within the same physical space such as, for example, a home, an office, a retail space, a warehouse, etc. The wall-plate system 102 enables a user 106 to control local and remote devices as well as local and remote third-party devices (collectively referred to herein as "devices" without intent to limit). The wall-plate system 102 may further provide the user 106 with access to proprietary (e.g., affiliated with the wall-plate system 102) and/or third-party service platforms 116 and 118, respectively, such as, for example, cloud service platforms as described further herein (collectively referred to herein as "cloud service platforms" without intent to limit). The wall-plate system 102 may control the devices with any type of automation function, routine, action, activity, or control such as, for example, implementing a predetermined lighting scene with lighting devices that are not powered off by an in-wall device such as the in-wall device 104. For instance, the in-wall device 104 may comprise a light switch coupled with one or more lighting devices. While the lighting devices remain powered through the in-wall device 104, the wall-plate system 102 may control brightness and/or color of one or more of the lighting devices as a group or individually.

The user 106 may also interact with the cloud service platforms to engage services provided by the cloud service platforms and/or to control remote devices to implement automation through the cloud service platforms. In various embodiments, a user input component 105 of the user interface of the wall-plate system 102 may be associated or linked to a predetermined automation activity. The user input component 105 may comprise a capacitive switch, or other switch, proximity sensor, paddle switch, toggle switch, slide switch, microphone to receive vocal commands, and/or the like. In some embodiments. the user input component 105 may be attached to a printed circuit board assembly coupled with the backside of the wall-plate of the wall-plate system 102. The user input device may be coupled with a wireless communications interface 108 and may be located proximate to, e.g., a light source such as an LED or plurality of LEDs to highlight the location of the user input component 105.

In several embodiments, the user input component 105 may be centered in a light ring to diffuse the light from the LED or plurality of LEDs and an opaque material, or other light blocking material, may block light transmission (at least partially) through the center of the light ring to emphasize light emissions about the circumference of the light ring. Note that embodiments are not restricted to any particular opaque or other light blocking material. Light blocking materials may be paint, paper, plastic, metal, ink, and/or the like. Furthermore, the light blocking material may be opaque or translucent. In some embodiments, the light blocking material is close to transparent and, in other embodiments, the light blocking material is close to opaque. In other words, the translucency of the light blocking material may be selected based on the effect, particularly when viewed through the wall-plate after installation. For instance, different color wall-plates or wall-plates with different thicknesses may have different effects on the light from the ling ring so the light blocking material may also vary, if included in such embodiments.

When the user input component receives an input from the user 106, the wall-plate system 102 may cause transmission of one or more instructions to one or more devices to implement the automation activity, including an instruction to be handled by a cloud service platform. In some embodiments, for instance, the wall-plate system 102 may comprise a processor and memory to process an input from the user 106 to determine one or more instructions to transmit to one or more devices. In many embodiments, the wall-plate system 102 may receive user input from a user 106 and the user input may cause transmission of a trigger such as an instruction or a signal to initiate the predetermined automation activity. In some embodiments, a local or remote device may interpret the instruction or signal to determine one or more instructions to transmit to one or more devices. In such embodiments, the signal may comprise a packet including, e.g., an identifier for the wall-plate system 102 such as an address, an identifier for the local or remote device to which the signal is being transmitted such as an address. The addresses may be in any form such as a medium access control (MAC) address, a basic service set identifier (BSSID), a service set identifier (SSID), an assigned address, a compressed address, a truncated address, a hashed address, and/or the like. In further embodiments, the signal may include additional data such as audio data from the user 106, an instruction, a type of input, an address associated with an input, and/or the like.

As shown in FIG. 1, the wall-plate system 102 may comprise a wireless communications interface 108 (illustrated as the antenna coupled with the wall-plate system 102). The wireless communications interface 108 may comprise a baseband module coupled with one or more wireless transceivers, one or more radios, and one or more antennas, or antenna elements, to facilitate communication with wireless devices and/or cloud services platforms via one or more wireless communication protocols. In some embodiments, the wireless communications interface 108 may implement Bluetooth communications. In other embodiments, the wireless communications interface 108 may implement Wi-Fi communications such as Institute of Electrical and Electronics Engineers (IEEE) 802.11-2016, 802.15.4-2011, Zigbee, Z-wave, and/or the like. In still other embodiments, the wireless communications interface 108 may implement more than one type of wireless communications such as a Bluetooth communications and Wi-Fi communications.

To illustrate, some embodiments of the wall-plate system 102 may include a wireless communications interface 108 configured for Bluetooth communications, or other radio frequency (RF) system, and is designed to connect to one or more cloud service platforms via the Internet by pairing with a local device 112 that connects to the Internet via an area network such as a LAN. When the wall-plate system 102 is first powered on, the wall-plate system 102 may either actively seek a Bluetooth connection with the local device 112 or wait for a request from the local device 112. For instance, a user may have an application on a computer or smart phone to manage connections with the local device 112 and once the wall-plate system 102 is powered on and Bluetooth communications become available, the user request the local device 112 to detect new and available Bluetooth devices such as the wall-plate system 102. Once detected, the user may pair the local device 112 with the wall-plate system 102 by, e.g., automatically or by entering a standard pairing code for the wall-plate-system 102 into the application for the local device 112. In some embodiments, the wall-plate system 102 may include a lighted circle that shines through the face of the wall-plate to provide information to the user such as feedback to indicate that the wall-plate system 102 successfully paired with the local device 112. In other embodiments, the wall-plate system 102 may automatically pair with the local device 112 based on identification of the local device 112 as a recognized device and provide a green or white lighted circle to indicate the successful pairing or a red lighted circle to indicate an unsuccessful pairing. In still other embodiments, the user may use an application to communicate with the wall-plate system 102 and may pair the wall-plate system 102 with the local device 112 via a Bluetooth connection with the wall-plate system 102. Note that many embodiments are capable of 10's, 100's, and/or 1000's of different colors and colors for various indications performed by the lighted circle can be set by default to any of the colors at the time of manufacture and/or may be set by preference at any time.

Once paired with the local device 112, the wall-plate system 102 may interact with the local device 112 and/or a cloud service platform via the local device 112 to set up functionality or automated routines with one or more user inputs built into the wall-plate system 102. In some embodiments, the user may provide commands to the local device 112 to assign functionality or automated routines to each of the one or more user inputs in the wall-plate system 102. For example, one user input on the wall-plate system 102 may comprise a capacitive switch and the user may assign a weather announcement to the capacitive switch. As a result, when the user activates the capacitive switch, the wall-plate system 102 may flash, e.g., a white lighted circle on the face of the wall-plate system 102 and transmit an indication that the user selected the capacitive switch to the local device 112. The local device 112 may associate the user input of selection of the capacitive switch with annunciating the weather, communicate with a cloud services platform to obtain weather information or an audio weather announcement for a user-selected location or the local area of the location of the local device 112, and output an announcement of the weather either through a speaker within the local device 112 or a speaker communicatively coupled with the local device 112.

For both Bluetooth and Wi-Fi communications, the baseband module of the wireless communications interface 108 of the wall-plate system 102 may generate or receive packets that include a packet header, a payload, and a data integrity check. The data check may be optional for some communications.

Some embodiments implement one or more IEEE 802.11 standards (sometimes collectively referred to as "Wi-Fi"). Such standards may include, for instance, the IEEE 802.11-2016, IEEE 802.11ah-2016, IEEE 802.11ai-2016, IEEE 802.15.4-2011, IEEE 802.11ay/D3.0, IEEE 802.11ba/D3.0, and IEEE 802.11ax/D1.4. Some embodiments implement the IEEE standards in accordance with a Wi-Fi Alliance specification such as the Wi-Fi Peer-to-Peer (P2P) technical specification version 1.7 published in 2017. Some embodiments implement other wireless communication protocols such as Bluetooth or Bluetooth Low Energy in accordance with, e.g., the Bluetooth Core Specification v5.0 published Dec. 6, 2016, Bluetooth Mesh, Near Field Communication, Zigbee, Z-wave, one or more cellular communication standards such as one or more 3rd Generation Partnership Project (3GPP), 3GPP Long Term Evolution (LTE), 3GPP LTE-Advanced (LTE-A), 4G LTE, and/or 5G New Radio (NR), technologies and/or standards, one or more infrared communication protocols, etc. Some embodiments implement a combination of one or more protocols of one or more of the standards and/or specifications. The embodiments are not limited to these standards.

Figure 2:
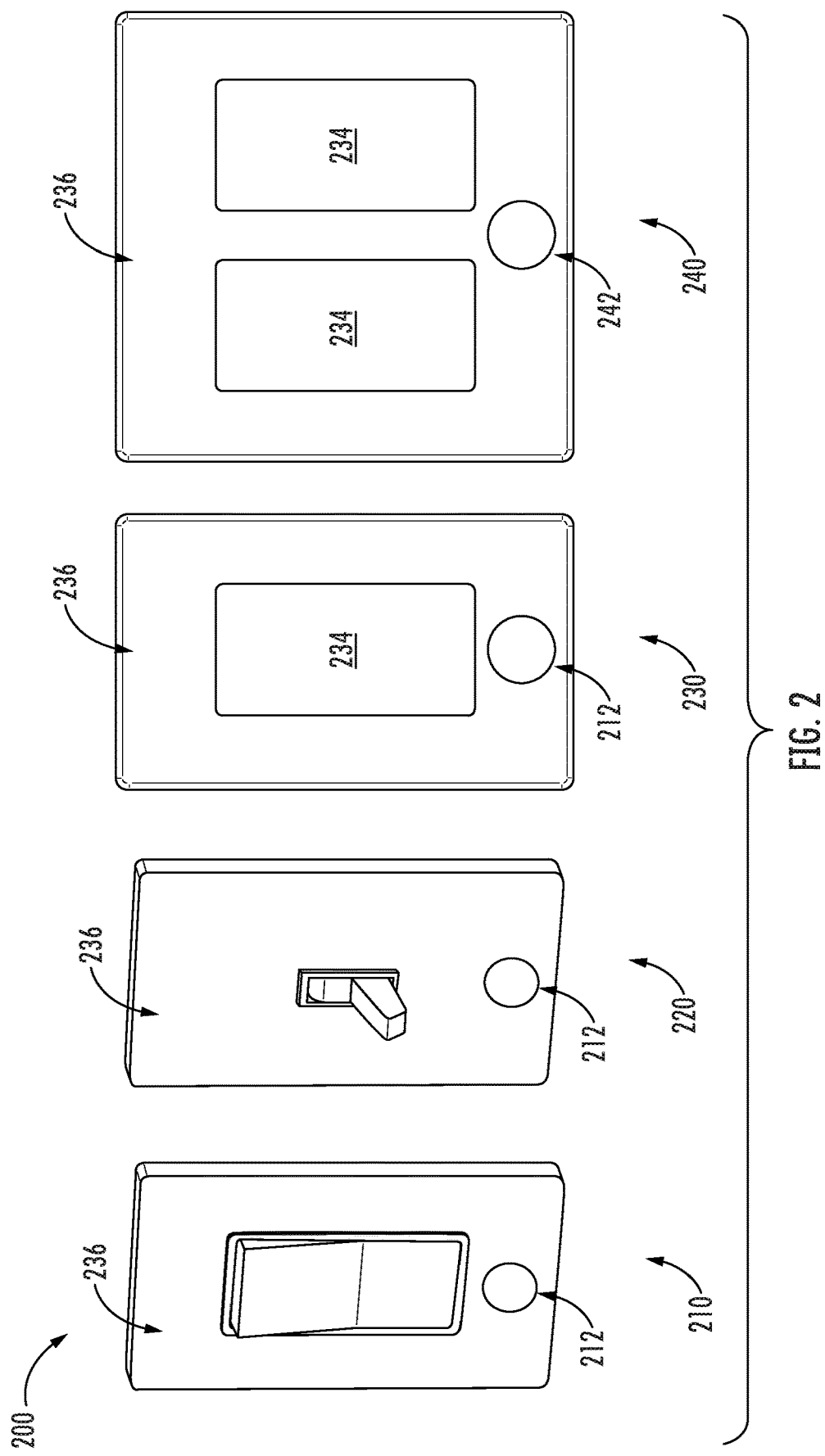
FIG. 2 illustrates screwless wall-plate embodiments installed with switches, as well as single-gang and dual-gang embodiments.

FIG. 2 illustrates embodiments of smart wall-plate systems 200 like the wall-plate system 102. Specifically, FIG. 2 illustrates a single-gang, screwless wall-plate that includes a smart wall-plate system also referred to as a wall-plate system 210 installed with a paddle switch. The wall-plate system 210 includes a lighted circle 212 on the face (first surface 236) of the wall-plate system 210. The lighted circle 212 may comprise light emitted from a light ring on a second surface (not shown in this figure) of the wall-plate system 210 and the lighted circle may highlight a capacitive touch switch (not shown in this figure) that can be programmed to perform one or more of numerous tasks such as provide the weather through a remote speaker or changing a lighting scene in an area proximate to the paddle switch.

Note that the screwless wall-plate may attach to a mounting bracket via snaps, magnetic connectors, grooves, latches, clamps, and/or the like. Other embodiments may attach the wall-plate with the mounting bracket via screws, bolts, and/or the like. Such embodiments may include two sets of mounting holes, one set for the in-wall device and one set for the junction box.

FIG. 2 also shows a wall-plate system 220 installed with a toggle switch. The first surface 236 of the wall-plate system 220 includes a lighted circle 212.

A wall-plate system 230 shows the first surface 236 with the lighted circle 212 but the wall-plate system 230 is not installed with a switch, outlet, or the like. The wall-plate system 230 includes a paddle-sized, utility opening 234. The wall-plate system 230, advantageously, can function without installation with a switch. In fact, some embodiments of the wall-plate system 230 include blank wall-plates, partially blank wall-plates, and/or the like, and can cover a portion of a wall, a hole in a wall, an unused junction box or a junction box used for wire pulls. Note that the phrase "utility opening", as used herein, refers to the opening for a switch, outlet, or the like, whereas the phrase "mount opening", as used herein, refers to the opening for, e.g., a screw to mount, attach, or couple the structure with another structure.

A wall-plate system 240 illustrates a double-gang, paddle-sized, wall-plate system. The wall-plate system 240 includes a lighted circle 242 and two paddle-sized, utility openings 234. Note that the position of the lighted circle 242 is centered between the two utility openings 234, whereas the single-gang, wall-plate systems 210, 220, and 230 include the lighted circle centered beneath the utility openings such as the utility opening 234. Note also that the placement of the lighted circle 212 is based on both aesthetics, functional design of the circuitry installed on the plate to control the lighted circle 212, and mechanical strength of the materials to meet design criteria and be durable enough to endure normal use. For example, the design criteria for many of the embodiments discussed herein relate to maintaining dimensions of the wall-plate system 230 or 240 to the same dimensions as a similar product line of wall-plates that do not include the circuitry. Maintaining the same dimensions can, advantageously, allow a customer to change out one or more selected wall-plates with the wall-plate systems 230 and/or 240 without disrupting the decor theme of the space, room, living area, work space, and/or the like.

Other embodiments may locate the lighted circle in another area of the first surface 236 of the wall-plate systems. Embodiments are not limited to a single location.

Figure 3:
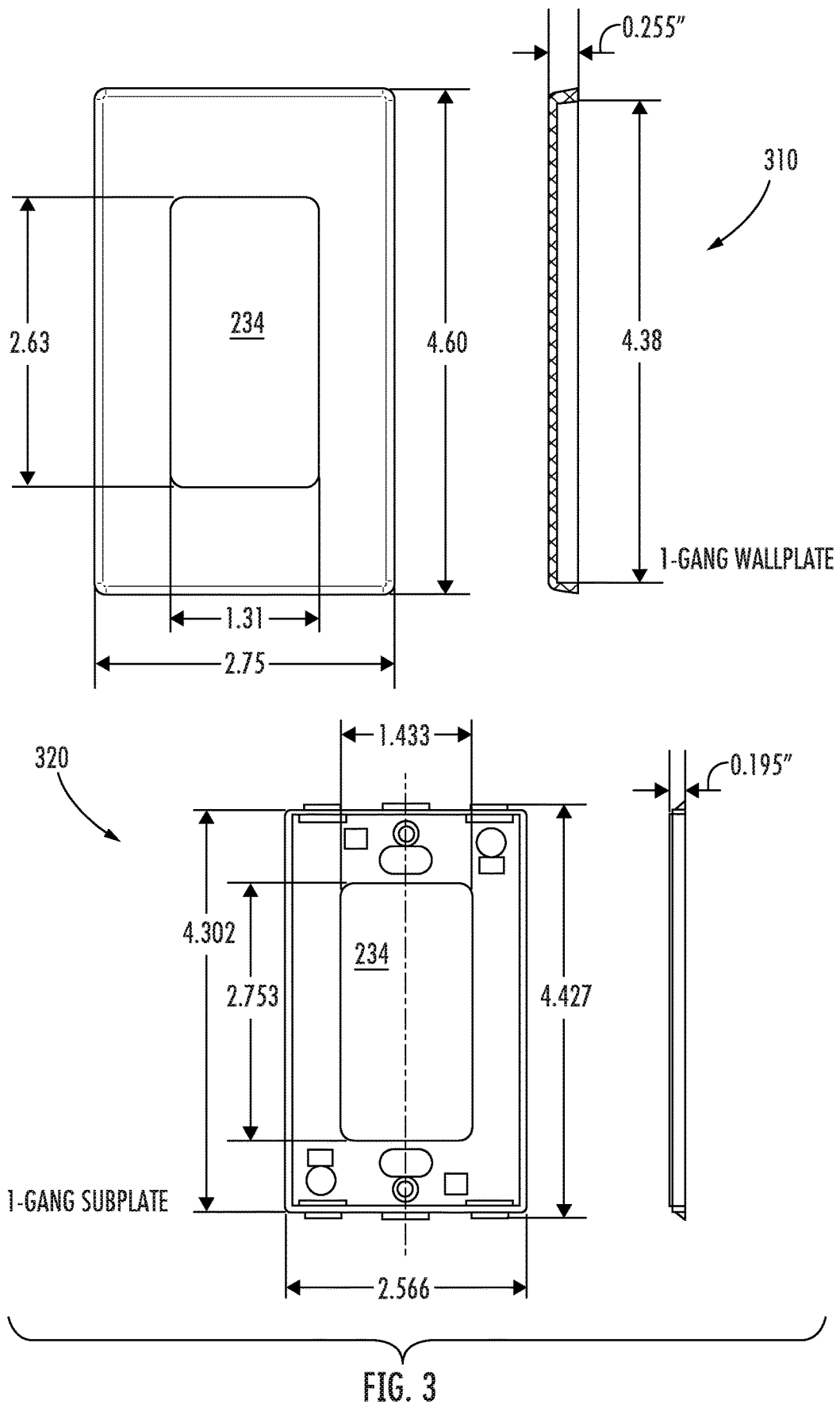
FIG. 3 illustrates dimensions for a single-gang embodiment.

FIG. 3 illustrates dimensions for a single-gang embodiment of a wall-plate system such as the wall-plate system 102. The dimensions of the single-gang (also referred to as 1-gang) wall-plate 310 include a height of 2.63 inches for the paddle-sized, utility opening 234, a width of 1.31 for the paddle-sized, utility opening 234. The wall-plate has a height of up to 4.6 inches, a width of 2.75 inches, a second surface height of 4.39 inches, and a depth of 0.255 inches with a tolerance of plus/minus 0.005 (0.250 to 0.260) inches The 1-gang subplate 320, also referred to as a 1-gang mounting bracket or a single-gang mounting bracket, has a maximum height of 4.427 inches and a maximum width of 2.566 inches. The 1-gang subplate 320 has a paddle-sized, utility opening 550 with a maximum height of 2.753 inches and a maximum width of 1.433 inches. Note that while the depth of the 1-gang subplate 320 is shown as 0.195 inches with a tolerance of plus/minus 0.005 (0.190 to 0.200) inches, the depth varies to accommodate circuitry and/or other components and, in some embodiments, to advantageously add more structural support in areas not constrained by the inclusion of circuitry and/or other components.

Figure 4:
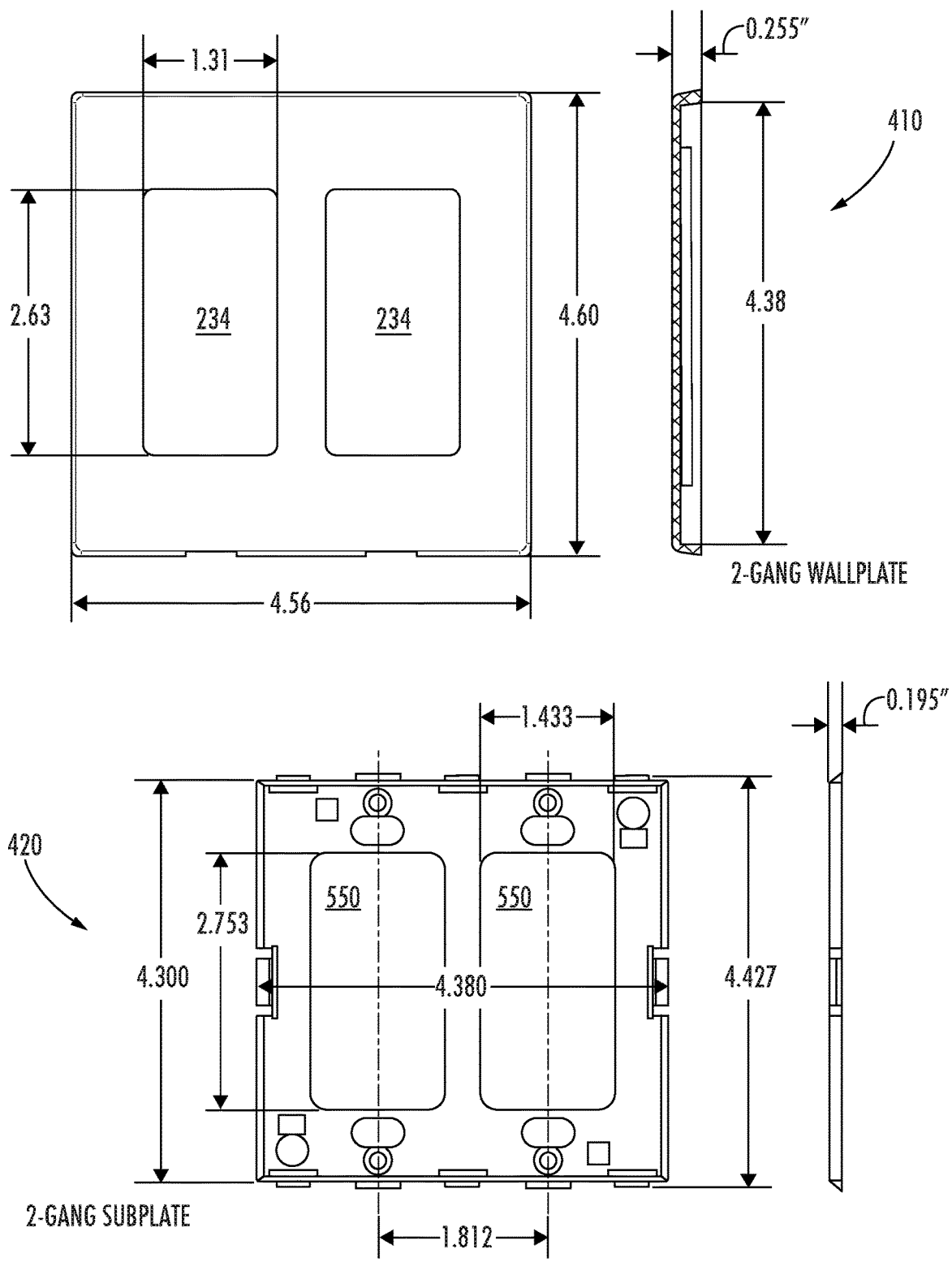
FIG. 4 illustrates dimensions for a double-gang embodiment.

FIG. 4 illustrates dimensions for a double-gang embodiment of a wall-plate system such as the wall-plate system 102. The dimensions of the double-gang (also referred to as 2-gang) wall-plate 410 include a height of 2.63 inches for the paddle-sized, utility opening 234, a width of 1.31 for the paddle-sized, utility opening 234. The wall-plate 410 has a height of up to 4.6 inches, a width of 4.56 inches, a second surface height of 4.38 inches, and a depth of 0.255 inches with a tolerance of plus/minus 0.005 (0.250 to 0.260) inches.

The 2-gang subplate 420, also referred to as a 2-gang mounting bracket or a double-gang mounting bracket, has a maximum height of 4.427 inches and a maximum width of 4.38 inches. The 2-gang subplate 420 has a paddle-sized, utility opening 550 with a maximum height of 2.753 inches and a maximum width of 1.433 inches. Note that while the depth of the 2-gang subplate 320 is shown as 0.195 inches with a tolerance of plus/minus 0.005 (0.190 to 0.200) inches, the depth varies to accommodate circuitry and/or other components and, in some embodiments, to advantageously add more structural support in areas not constrained by the inclusion of circuitry and/or other components.

Figure 5:
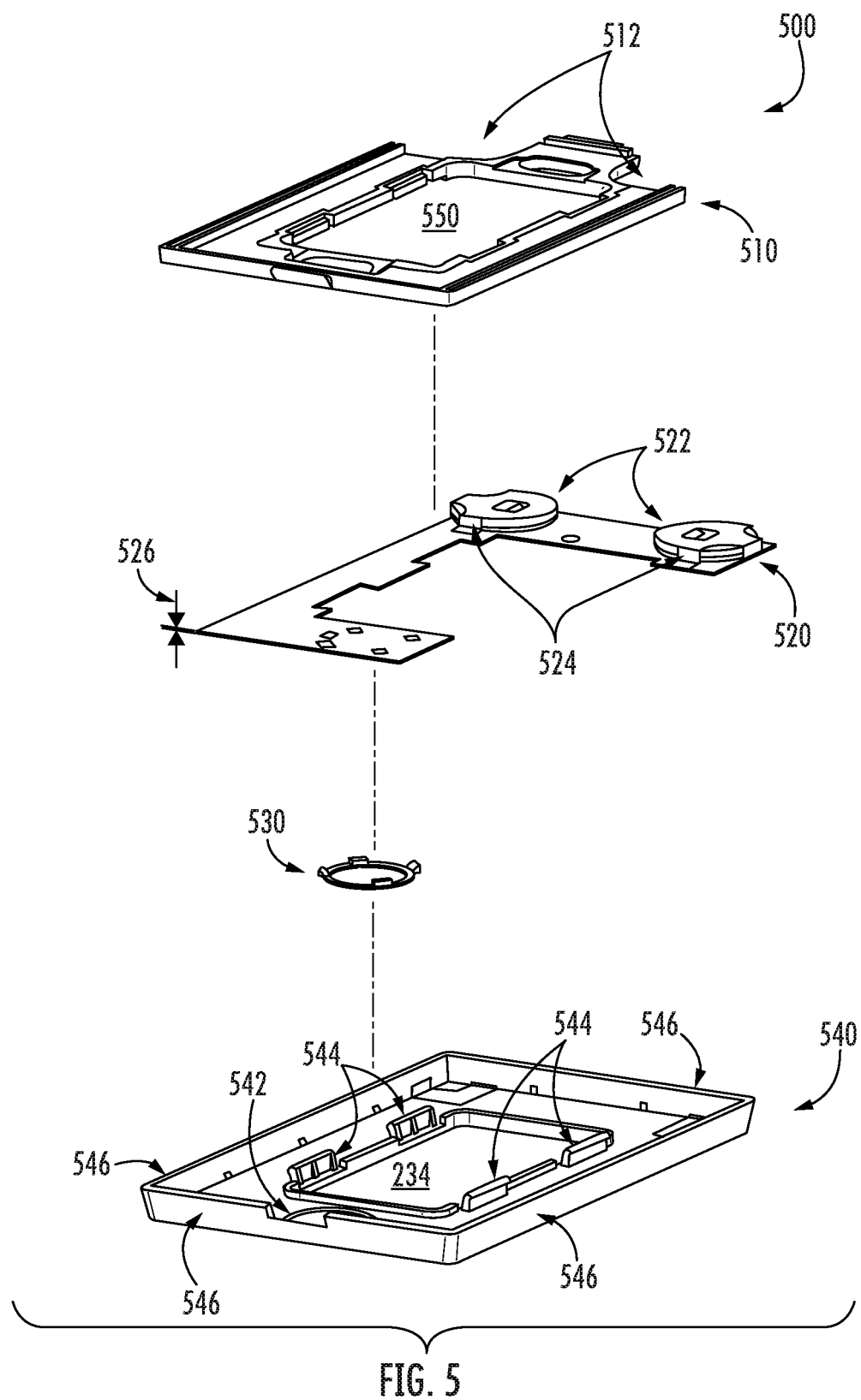
FIG. 5 illustrates an embodiment of the smart wall-plate system.

FIG. 5 illustrates an embodiment of the wall-plate system 500 such as the wall-plate system 102 in FIG. 1. FIG. 5 illustrates assembly of components of the wall-plate system 500. The wall-plate system 500 includes a mounting bracket 510, a printed circuit board assembly (PCBA) 520, a light ring 530, and a wall-plate 540 and these components are assembled by insertion of the light ring 530 into the depression 542 of the wall-plate 540, attachment of the PCBA 520 to the wall-plate 540, attachment of the mounting bracket 510 to, e.g., a junction box in a wall, and attachment of the wall-plate 540 with the light ring 530 and the PCBA 520 to the mounting bracket 510. Note that various embodiments may include other components.

In many embodiments, the light ring 530 is seated in the depression 542 and held in place by the PCBA 520 after the PCBA 520 is attached to the wall-plate 540. In several embodiments, a light blocking material (not shown) is included between the light ring 530 and a capacitive switch mounted on the wall-plate 540 side of the PCBA 520, which is the side of the PCBA 520 that is not visible in the view of FIG. 5. Thereafter, the PCBA 520 is attached to the wall-plate 540. In some embodiments, the PCBA 520 is attached to second surface of the wall-plate 540 by a thin, double-sided, high bond strength adhesive. In some embodiments, the adhesive is die cut from a thin sheet of adhesive. Such embodiments can increase the structural strength of the PCBA 520 over other attachment methods by potentially spreading torsion forces caused by prying the wall-plate 540 from the mounting bracket (also referred to as a mounting subplate) 510 to, e.g., exchange a depleted battery for a new battery. The added structural support in combination with a very thin, flexible PCBA 520 having a depth 526 (or thickness) of 0.015 inches to 0.019 inches, may, advantageously reduce the chances of fracturing the PCBA 520 during removal of the wall-plate 540 from the mounting bracket 510. Furthermore, the adhesive may, advantageously maintain contact between the wall-plate 540 and the capacitive switch (not shown) and, thus, avoid degradation of the effectiveness of the capacitive switch.

In other embodiments, the PCBA 520 may be attached to the wall-plate 540 via mounting blocks on the second surface (inner surface) of the wall-plate 540 and screws through the wall side of the PCBA 520 into the mounting blocks. In still other embodiments, the PCBA 520 may couple with the wall-plate 540 via snaps 544.

The mounting bracket 510 illustrates a shape of the mounting bracket adapted to accommodate battery mounts 522. In the present embodiment, the mounting bracket 510 has a shape with two concave features 512 to allow the battery mounts 522 to extend from the PCBA 520 into a plane of the mounting bracket 510 via the concave features 512. In some embodiments, the two battery embodiments may provide 18 to 24 months of use or longer. In other embodiments, the PCBA 520 may include more or less battery mounts and may or may not require the concave features 512. For instance, a lower profile battery mount may only require one or more cavities in the wall-plate 540 side of the mounting bracket 510. Many embodiments of the mounting bracket 510 also include cavities for circuitry and/or other components in the wall-plate 540 side (not visible in this figure) of the mounting bracket 510.

In still other embodiments, the PCBA 520 may be powered by a different mechanism such as one or more solar cells or a power harvester. The solar cells and/or the power harvester may gather power to recharge a rechargeable battery. The power harvester, for example, may gather power from radio frequency (RF) waveforms. In other embodiments, the power harvester may gather energy from a nearby alternating current (AC) power source by capturing shifting electromagnetic energy via one or more coils such as copper coils.

In the present embodiment, the PCBA 520 may include one or two batteries in the battery mounts 522. The battery mounts 522 each include two hooks (see, e.g., hooks 1020 in FIG. 10B) and a solder point 524 to affix the battery mounts to the PCBA 520. The hooks wrap around from the battery mounts on the wall side of the PCBA 520 to the opposite side of the PCBA 520, which is the wall-plate 540 side of the PCBA 520.

The wall-plate 540 includes a first surface 236 (shown in FIG. 2) that faces outward from the wall after installation and a second surface (inner surface) with the depression 542 and the snaps 544. The wall-plate 540 includes edges 546 and a paddle-sized, utility opening 234. In other embodiments, the utility opening 234 may comprise a toggle-sized, utility opening to accommodate extension of a toggle switch from the junction box through the wall-plate 540. While the wall-plate 540 shown in FIG. 5 is illustrated as a single-gang wall-plate, the wall-plate 540 can represent a double-gang or more-gang wall-plate except that the PCBA 520 in installed about the left-most utility opening 234 or 755. In other embodiments, the PCBA 520 may be installed about the right-most utility opening or an opening between the right-most and the left-most opening, which may require adjustment to the location of the snaps 544 between utility openings 755 illustrated in the double-gang wall-plate 540 in embodiment 750 in FIG. 7B.

Figure 6:
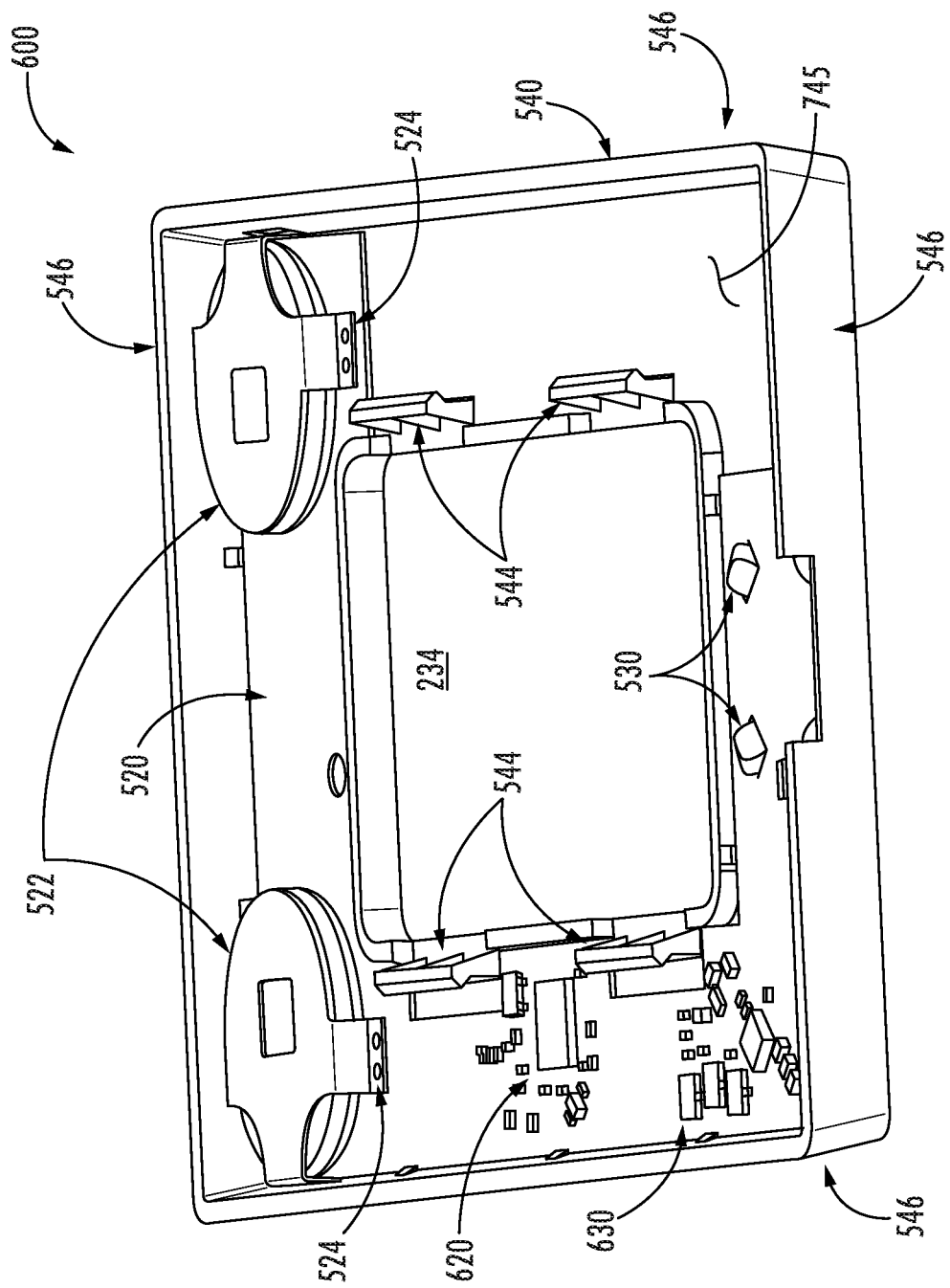
FIG. 6 illustrates an embodiment of the smart wall-plate system.

FIG. 6 illustrates embodiments of a wall-plate system 600 such as the wall-plate system 102. FIG. 6 illustrates the wall side of the wall-plate 540 with a PCBA 520 installed in the wall-plate 540. The wall-plate 540 includes edges 546, a utility opening 234, and snaps 544. The PCBA 520 includes two battery mounts 522 with solder points 524. The PCBA 520 may include one or more chip packages such as a System-on-a-Chip (SoC) 620 and/or other components such as the components 630. The chip packages may comprise, for example, one or more integrated circuits mounted inside a package with inputs and outputs accessible via pins, prongs, pads, and/or the like. In many embodiments, an integrated circuit in a chip package is a circuit of including transistors integrated in a wafer such as a silicon wafer, a glass wafer, and/or the like. Other components may comprise diodes such as light emitting diodes, transistors, resistors, capacitors, capacitive switches, other integrated circuits, printed circuit boards, battery mounts, antennas, and/or the like. In the present embodiment, the light ring 530 is mounted on the PCBA 520 on the wall-plate 540 side of the PCBA 520. In other embodiments, the light ring 530 is seated in a depression (such as depression 1320 shown in FIG. 13C) in the second surface 745 of the wall-plate 540 and is held in place by the PCBA 520 after the PCBA 520 is mounted to the wall-plate 540.

Figure 7B:
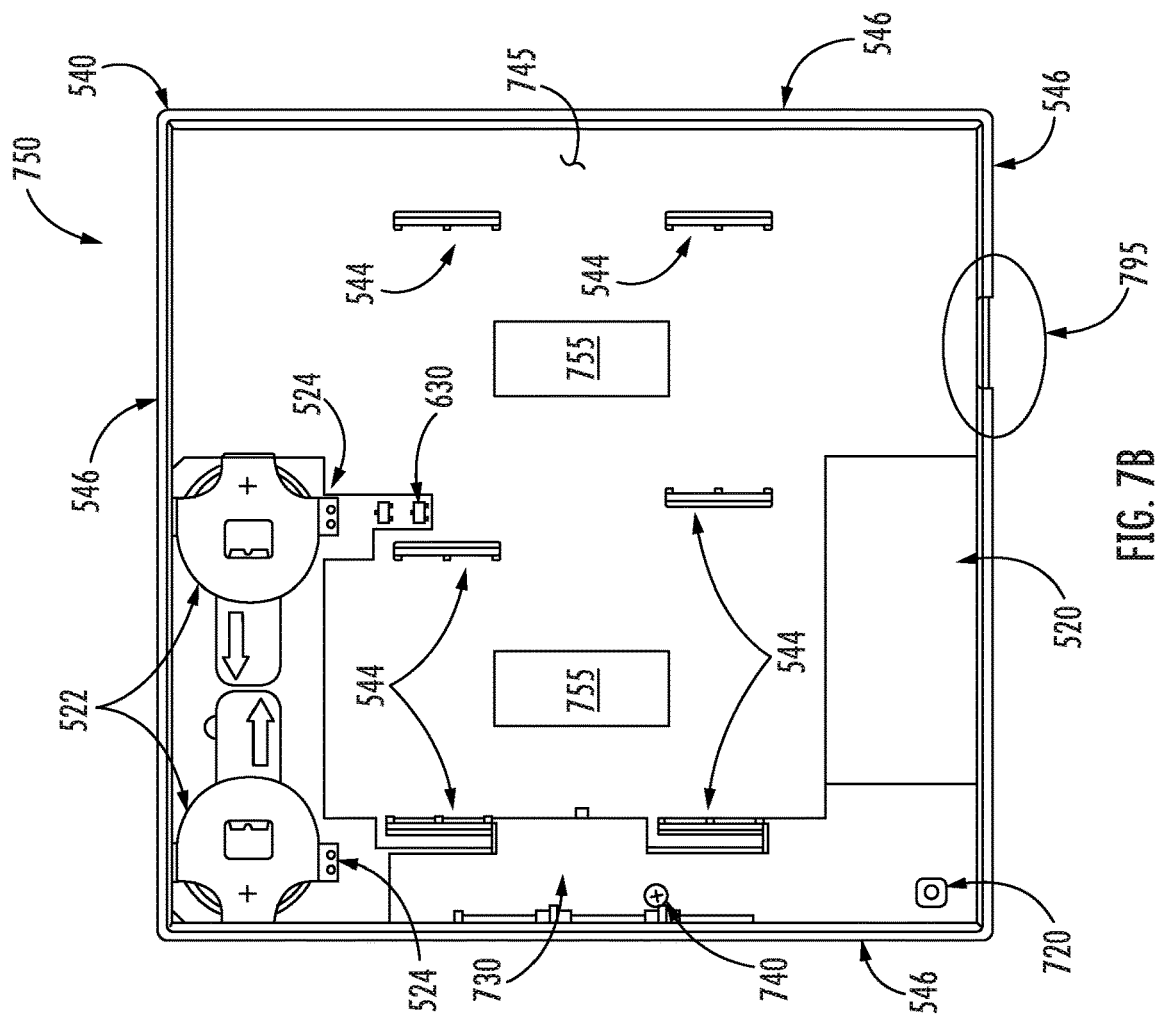
FIGS. 7A-B illustrate embodiments of a single-gang smart wall-plate system for, e.g., a paddle switch and a double-gang smart wall-plate system for toggle switches.
Figure 7A:
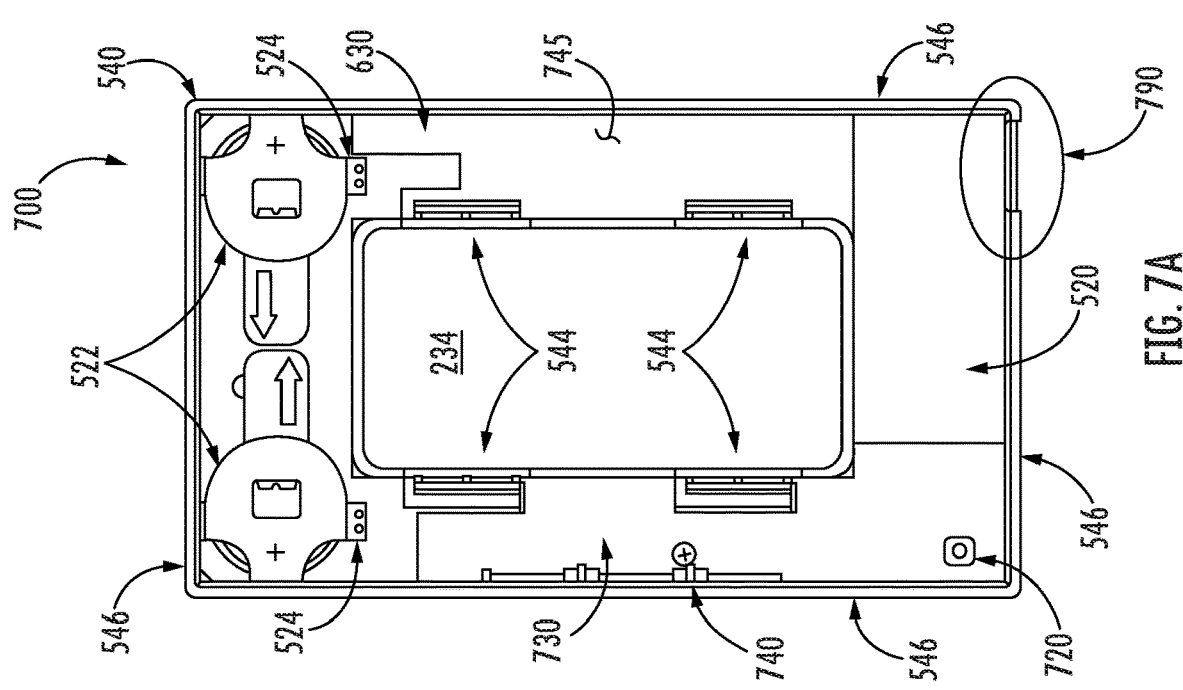

FIGS. 7A and 7B illustrate embodiments of a single-gang wall-plate system 700 such as the wall-plate system 102 for, e.g., a paddle switch and a double-gang wall-plate system 750 such as the wall-plate system 102 for, e.g., toggle switches. The wall-plate systems 700 and 750 depict the second surface 745 on the mounting bracket side of the wall-plates 540. In the present embodiment, both the single-gang wall-plate 540 and the double-gang wall-plate 540 may include the same size and shape printed circuit board assembly, PCBA 520. In other embodiments, different PCBAs in terms of size, shape, and/or component configurations are included in differing wall-plate systems. For instance, double-gang smart wall plate systems may have different PCBAs than single-gang wall-plate systems and/or wall-plate systems with paddle-sized openings 234 may include different PCBAs than wall-plate systems with toggle-sized openings 755.

In some embodiments, the PCBA 520 may only activate or may only include the capacitive switch 1030 (shown in FIGS. 10B and 11) located for use for single-gang wall-plates 540 for the wall-plate system 700 or the capacitive switch 1130 (shown in FIG. 11) located for use for double-gang wall-plates 540 for the wall-plate system 750. Other embodiments may include a hardware switch or a software driven switch along with the appropriate code and/or data or preference to select the appropriate capacitive switch. In still other embodiments, both capacitive switches can operate in single-gang and double-gang installations. In further embodiments, a user preference can be set to select the use of one of the capacitive switches or both. In still other embodiments, additional capacitive switches may be included on the wall-plate side of the PCBA 520 and one or more of or all of the capacitive switches may be activated contemporaneously. In one embodiment, the entire wall-plate side surface of the PCBA 520 is coated to be a capacitive touch such as a touch screen and a large number of capacitive switches (only limited by the granularity available via the PCBA 520) can be activated individually, in groups, and/or simultaneously.

FIG. 7A illustrates the single-gang paddle switch smart wall-plate 700 for a system such as the wall-plate system 102. The single-gang paddle switch smart wall-plate 700 may comprise a paddle-sized, utility opening 234 and four snaps 544 proximate to the utility opening 234 to secure the wall-plate 700 to a mounting bracket such as the mounting bracket 510 shown in FIG. 5. FIG. 7B illustrates the double-gang toggle switch smart wall-plate 750 for a system such as the wall-plate system 102. The double-gang toggle switch smart wall-plate 750 may comprise two toggle-sized, utility openings 755 and four snaps 544 proximate to the openings 755 to secure the wall-plate 700 to a mounting bracket such as the mounting bracket 510 shown in FIG. 5.

The wall-plate systems 700 and 750 in FIGS. 7A-B depict the snaps 544 away from the edges 546 of the wall-plates 540 and towards the center of the respective wall-plates 540. In the present embodiment, the locations of the snaps on the second surface 745 (inner surface) of the double-gang wall-plate 540 are selected to accommodate either paddle-sized, utility openings 234 or toggle-sized, utility openings 755. In other embodiments, the locations of the snaps 544 may differ for different sized openings. Furthermore, embodiments described herein are not limited to paddle-sized or toggle-size openings. Wall-plates 540 may not have utility openings (blank wall-plates) or may include openings of other sizes and shapes. Furthermore, wall-plates 540 with multiple openings. For instance, the double-gang wall-plates 540 may include more than one openings and the more than one openings may have different dimensions and/or different shapes. Note also that embodiments herein are not limited to single-gang or double-gang wall-plates 540. Wall-plate systems may include any number of gangs such as 3-gang wall-plates, 4-gang wall-plates, 5-gang wall-plates, and/or more-gang wall-plates.

The PCBAs 520 in the wall-plate systems 700 and 750 may include two battery mounts 522 along the top edge 546 of the PCBAs 520, a shield 730 covering components 630 along a portion of the left edge of the PCBA 520 and additional components 630 below the right battery mount 522 and proximate to the utility opening 234 of wall-plate system 700 and the right opening 755 of wall-plate system 750. The battery mounts 522 couple with the PCBA 520 via two hooks about the edges of the PCBA 520 and solder points 524 below the battery mounts 522.

The shield 730 may comprise a plastic shield attached to the PCBA 520 via a screw mount 740. In other embodiments, the shield 730 may comprise a metal or other material. In many embodiments, a factory reset 720 may be a factory reset button accessible through the shield 730. The factory reset 720 may reset settings or preferences for, e.g., input/output communications such as wireless communications from the current user modified settings back to factory default settings or factory settings.

In some embodiments, the shield 730 may protect chip packages and/or other components from physical damage. In further embodiments, the shield 730 may also or alternatively protect the chip packages and/or other components from electrostatic damage.

Figure 11:
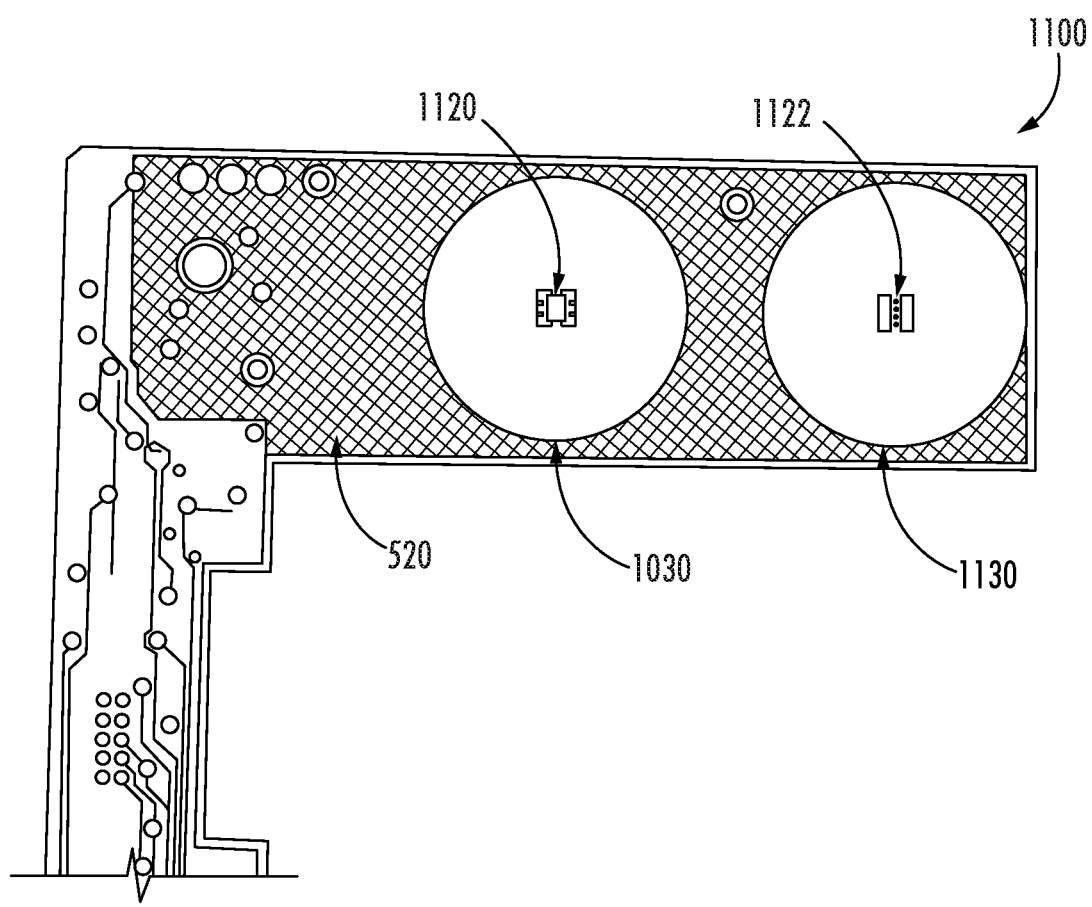
FIG. 11 illustrates an embodiment of capacitive switches, a light emitting diode (LED) and an LED mount on a wall-plate side of a PCBA.

The PCBA 520 may also comprise one or more capacitive switches 1030 and 1130 shown in FIG. 11 on the wall-plate 540 side of the PCBA 520 along the bottom edge 546 of the wall-plate systems 700 and 750. Note that while smart wall-plates 700 and 750 include LED rings 530 in depressions of the wall-plates 540 on the wall-plate 540 side of the PCBAs 520, the LED rings 530 are not attached through the PCBA 520 in these embodiments. The LED rings 530 are held in the depressions of the wall-plates 540 on the wall-plate 540 side of the PCBAs 520 via the PCBAs 520. In some embodiments, openings on the bottom edge 546 of the wall-plates 540 of the wall-plate systems 700 and 750 may be disassembly features 790 and 795, respectively. The disassembly features 790 and 795 may be locations for disassembly of the mounting brackets 510 from the wall-plates 540 of the wall-plate systems 700 and 750 via, e.g., use of a flathead screwdriver to pry the wall-plates 540 from the mounting brackets 510.

Figure 8B:
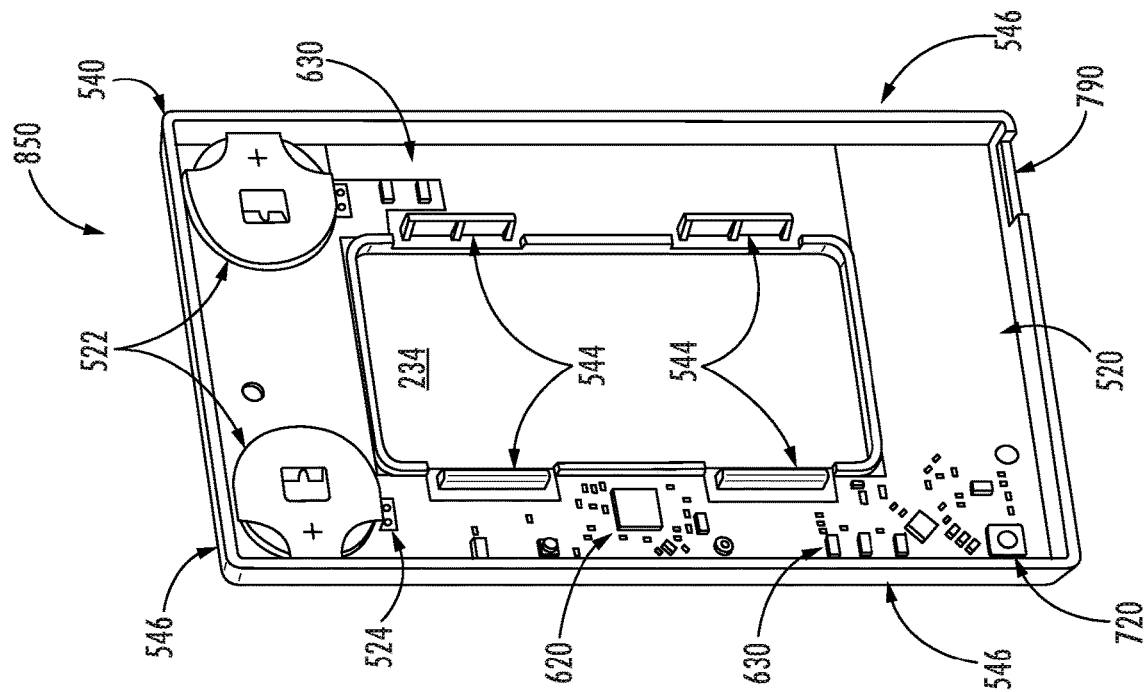
FIGS. 8A-B illustrate embodiments of a single-gang smart wall-plate system with and without a shield for chip packages and/or other components on a printed circuit board assembly (PCBA)
Figure 8A:
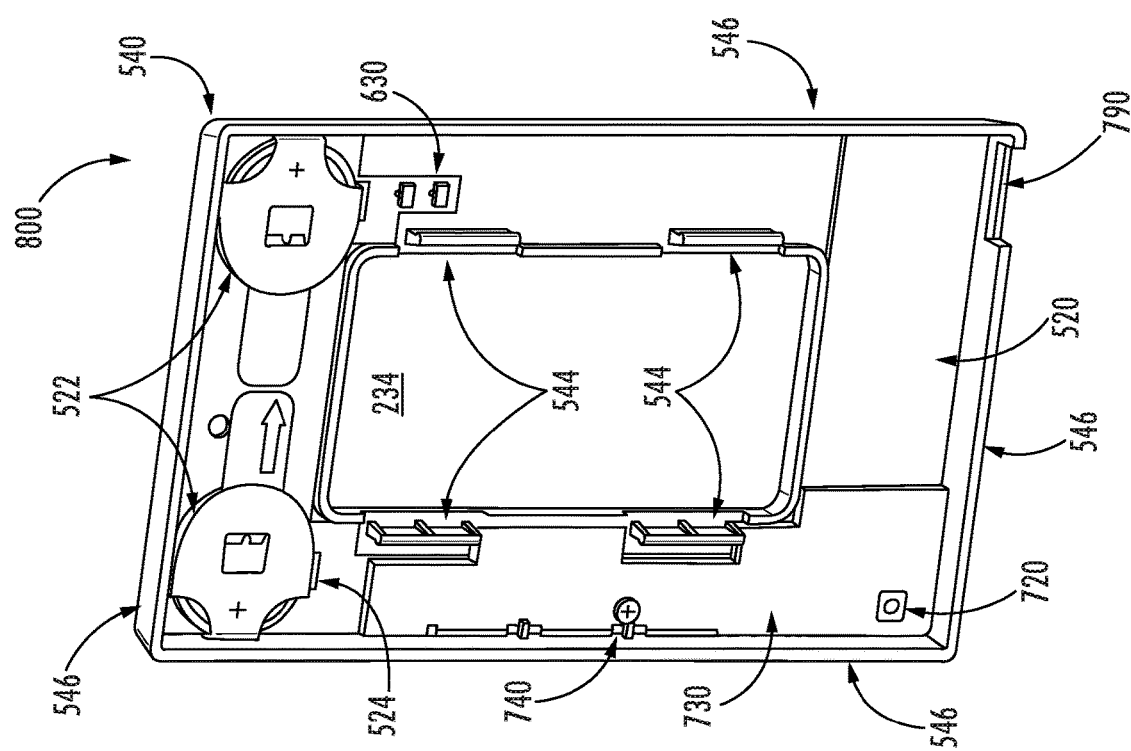

FIGS. 8A-B illustrate embodiments 800 and 850 of the single-gang smart wall-plate 700 with a shield 730 and without a shield 730 for chip packages and/or other components 620 and 630 on the PCBA 520. In particular, the embodiment 800 illustrates the wall-plate system 700, such as the wall-plate system 102, with the shield 730 as shown in FIG. 7A. The embodiment 850 illustrates the wall-plate system 700, such as the wall-plate system 102, without the shield 730 to illustrate the components 620 and 630 that may be protected by the shield 730 in this embodiment, if included. In some embodiments, the shield 730 protects against physical damage of components 620 and 630 prior to installation as well as during removal of the wall-plate 540 from a mounting bracket 510. In further embodiments, the shield 730 may comprise a metal and may also function as an RF shield for components underneath.

Figure 9B:
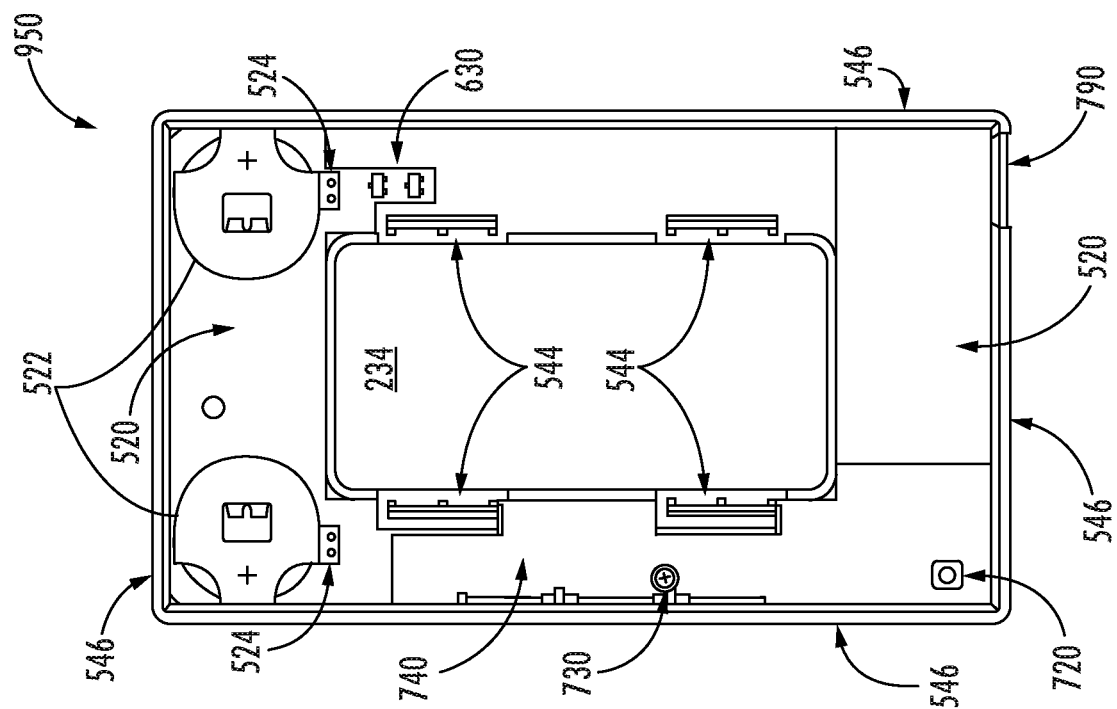
FIGS. 9A-B illustrates embodiments of a single-gang smart wall-plate system with and without a mounting bracket.
Figure 9A:
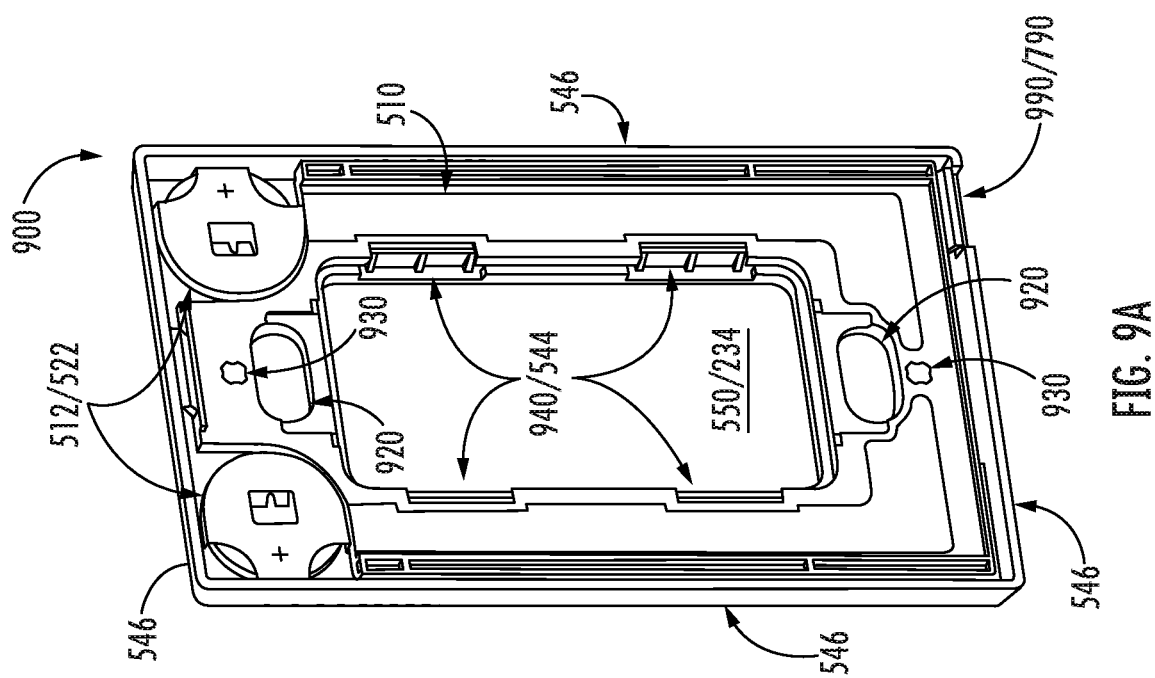

FIGS. 9A-B illustrate embodiments 900 and 950 of the single-gang smart wall-plate 700 with a mounting bracket 510 and without the mounting bracket 510 attached to the wall-plate 540 such as the wall-plate system 102. In particular, the embodiment 950 illustrates the wall-plate system 700 with the shield 730 as shown in FIG. 7A. The embodiment 900 illustrates the wall-plate system 700 attached to the wall-plate 540 via the snaps 544 at snap locations 940 on the mounting bracket 510.

The mounting bracket 510 may include concave features 512 at the top corners of the mounting bracket 510 to facilitate extension of the battery mounts 522 into a plane of the mounting bracket 510 after installation of the wall-plate 540 on the mounting bracket 510. In other embodiments, the PCBA 520 may include different shape battery mounts and the shape of the concave features 512 may differ to match the shape of the battery mounts 522. In still other embodiments, the battery mounts 522 may extend into cavities of the mounting bracket 510.

The mounting bracket 510 may also include openings 920 and 930. The opening 920 may be located at the mounting holes of a junction box to mount the mounting bracket 510 to the junction box if no in-wall device is installed or to mount the mounting bracket 510 to the junction through an in-wall device to mount the mounting bracket 510 and the in-wall device to the junction box. In many embodiments, the opening 920 on the mounting bracket 510 is not used because an in-wall device is mounted to the junction box and the mounting bracket 510 is attached to the in-wall device via the openings 930.

The in-wall device may be accessible at the first surface 236 of the wall-plate 540 through the paddle-sized, utility opening 234 and the paddle-sized opening 550 in the mounting bracket 510. Furthermore, the mounting bracket 510 may include a pry feature 990 in the disassembly feature 790 at the bottom of the embodiment 900 to facilitate prying the mounting bracket 510 off the snaps 544 of the wall-plate 540 to remove the wall-plate 540 from the mounting bracket 510. In many embodiments, the pry feature 990 may, advantageously protect the PCBA 520 from damage during removal of the wall-plate 540 from the mounting bracket 510 by, e.g., preventing an edge of, e.g., a flat-head screwdriver from contacting the PCBA 520 while applying force against the wall-plate 540.

Figure 10A:
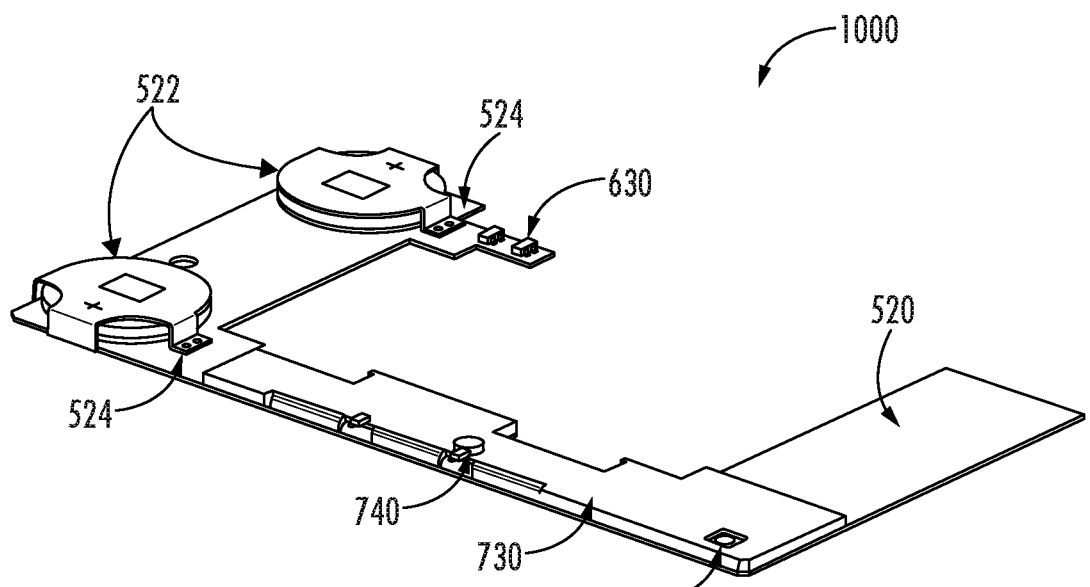
FIGS. 10A-B illustrates an embodiment of a wall-plate side and a mounting bracket side of a PCBA.
Figure 10B:
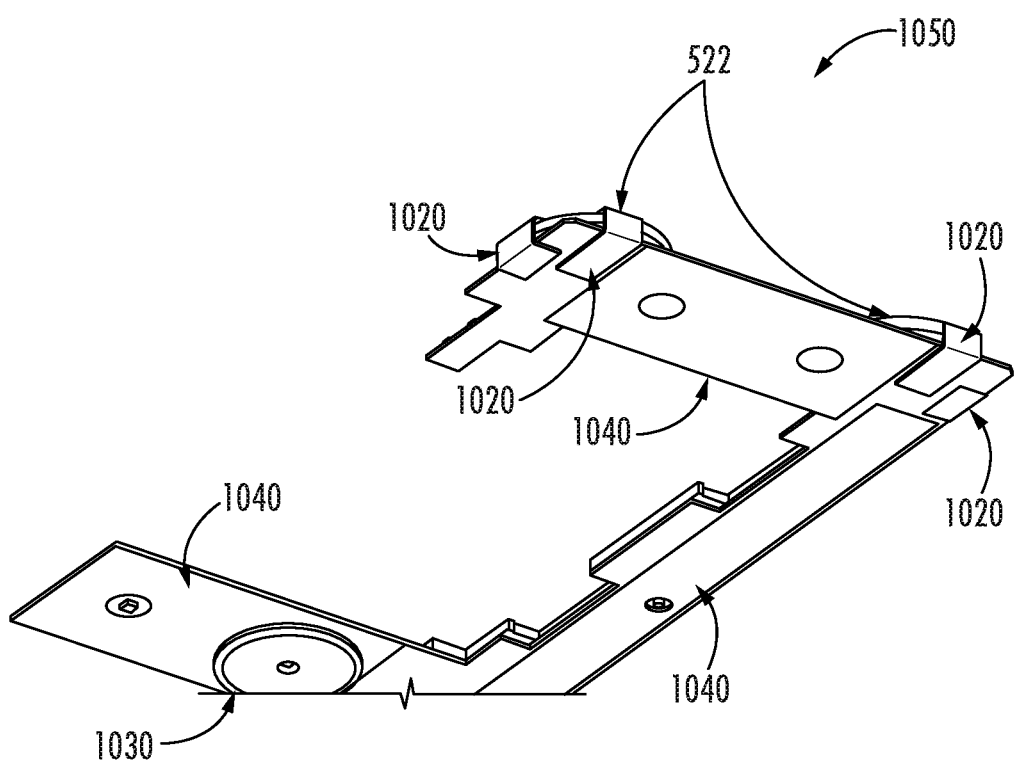

FIGS. 10A-B illustrate embodiments 1000 and 1050 of the PCBA 520 shown in FIGS. 5-9. In FIG. 10A, the embodiment 1000 shows the mounting bracket 510 side of the PCBA 520. The embodiment 1050 in FIG. 10B shows the wall-plate 540 side of the PCBA 520. In particular, the embodiment 1050 shows the hooks 1020 for the battery mounts 522, the capacitive switch 1030, and a die cut, thin, double-sided, high bond strength adhesive 1040 attached to the wall-plate 540 side of the PCBA 520.

FIG. 11 illustrates an embodiment 1100 of capacitive switches 1030 and 1130, an LED 1120, and an LED mount 1122 on a wall-plate 540 side of a PCBA 520 for a wall-plate system such as the wall-plate system 102. The capacitive switches 1030 and 1130 are located to be in the center of the bottom of a single-gang and double-gang wall-plate 540, respectively, for aesthetics and for easy access without accidental touches. The capacitive switches 1030 and 1130 may be mounted to maintain the capacitive switches 1030 and 1130 in contact with the wall-plate 540 to avoid degradation of the operation of the capacitive switches 1030 and 1130.

In other embodiments, the capacitive switches 1030 and 1130 may be located in other positions about the PCBA 520. In further embodiments, the capacitive switches 1030 and 1130 may be replace with other types of switches such as buttons, toggle switches, slide switches, rotary switches, proximity switches, any other type of switches, and/or any combination thereof.

The LED 1120 may comprise multiple or a plurality of LEDs or sets of LEDs. In many embodiments, the LED 1120 comprises red, green, and blue (RGB) LEDs. A set of red, green, and blue LEDs can be combined to emit multiple different colors of light depending on the intensity of emissions from each of the different colors of LEDs. As a result, in many embodiments, the color of the light emitted from the LEDs may vary, may vary based on the function being performed, may vary based on the type of confirmation being conveyed, and/or the like.

Figure 12A:
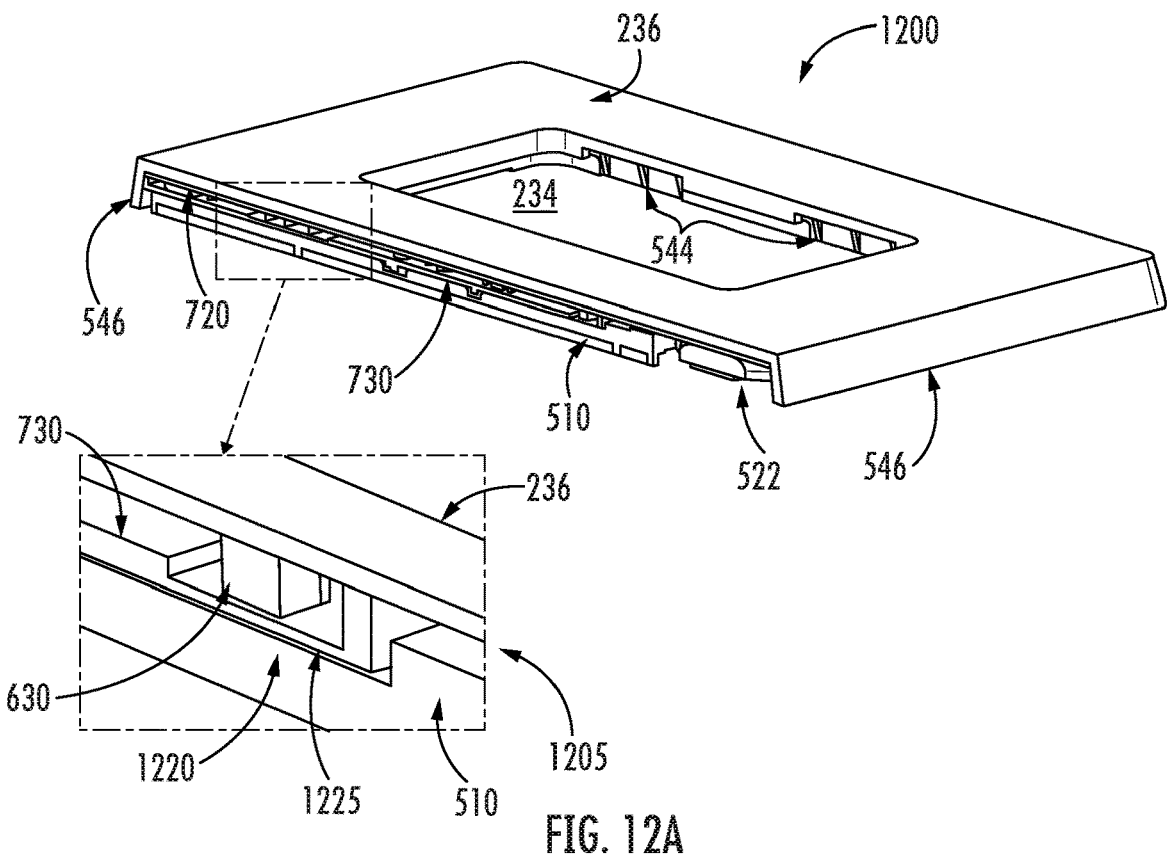
FIGS. 12A-B depicts embodiments of cavities of a mounting bracket and components extending into the cavities.
Figure 12B:
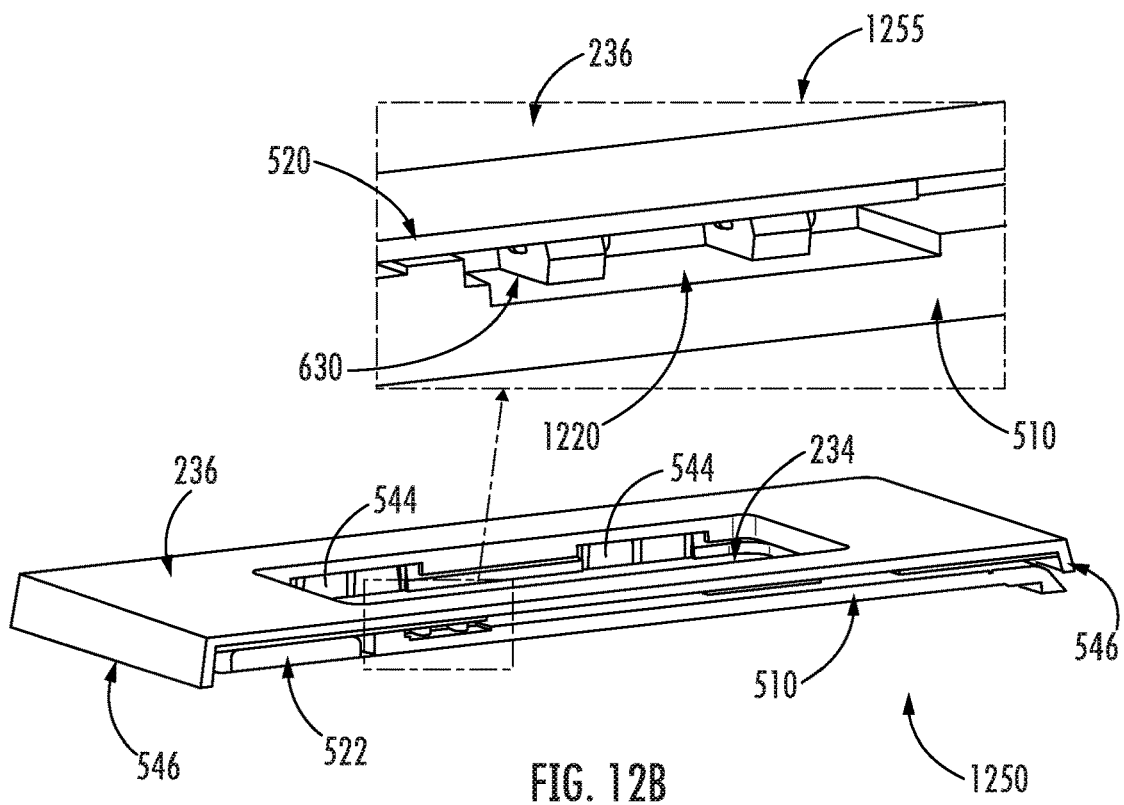

FIGS. 12A-B illustrate cross-sections 1200 and 1250 of the embodiment 900 in FIG. 9A of the wall-plate system 700 mounted to the mounting bracket 510. The cross-section 1200 in FIG. 12A shows the first surface 236 of the wall-plate 540 of the wall-plate system 700, a utility opening 234, snaps 544, and edges 546. The cross-section 1200 removes a portion of the left side of the wall-plate system 700 to reveal the left battery mount 522, the mounting bracket 510, the shield 730, and the factory reset 720. A zoomed view 1205 of a portion of the cross-section 1200 illustrates a cavity 1220 of the mounting bracket 510 and a cavity 1225 of the shield 730 to accommodate the extension of a component 630 into a plane of the mounting bracket 510. In other embodiments, the shield 730 may be replaced with an epoxy coating or other protective cover or coating.

The cross-section 1250 in FIG. 12B shows the first surface 236 of the wall-plate 540 of the wall-plate system 700, a utility opening 234, snaps 544, and edges 546. The cross-section 1250 removes a portion of the right side of the wall-plate system 700 to reveal the right battery mount 522, the components 630 below the right battery mount 522, and the mounting bracket 510. A zoomed view 1255 of a portion of the cross-section 1250 illustrates a cavity 1220 of the mounting bracket 510 to accommodate the extension of the components 630 into a plane of the mounting bracket 510.

FIGS. 13A-C illustrate embodiments 1300, 1350, and 1390 of the light ring 530 and the lighted circle 232 of the wall-plate system 700. The embodiment 1300 in FIG. 13A shows the second surface 745 (or inner surface) of the wall-plate 540 of the wall-plate system 700, a utility opening 234, shield 730, opening 1312 in the shield for access to the factory reset, disassembly feature 790, and edges 546. The embodiment 1300 removes the PCBA 520 to show the relative position of the light ring 530. The embodiment 1300 also shows the light ring 530 seated in a depression 1320 in the second surface 745 of the wall-plate 540 and an opening 1310 in the center of the light ring 530 to receive the LED 1120 shown in FIG. 11.

The embodiment 1350 in FIG. 13B shows the first surface 236 of the wall-plate 540 of the wall-plate system 700, a utility opening 234, lighted circle 232, disassembly feature 790, and edges 546. The embodiment 1350 illustrates where the lighted circle 232 will be when lit. In some embodiments, the lighted circle 232 is always lit. In some embodiments, the lighted circle 232 is lit as feedback to actions by a user. In some embodiments, the lighted circle 232 is lit in response to a sensor such as a proximity sensor.

The embodiment 1390 in FIG. 13C shows a cross-sectional view looking towards the second surface 745 of the wall-plate 540 of the wall-plate system 700. The cross-sectional view shows utility opening 234, shield 730, a depression in the second surface 745 of the wall-plate 540, the lighted ring diffuser 542 seated in the depression 1320, and the LED 1120 extended from the PCBA 520 at the center of the capacitive switch 1030 into the opening 1310 of the light ring 530, light ring 530, and the PCBA 520. Other embodiments may include a light blocking material between the capacitive switch 1030 and the light ring 530 with an opening in the light blocking material to accommodate extension of the LED 1120 into the opening 1310 of the light ring 530.

FIG. 14 illustrates an embodiment 1400 of a portion of the wall-plate system 700 with a wire antenna 1420 and an antenna array in a chip package 1410. The embodiment 1400 shows a portion of the second surface 745 (or inner surface) of the left side of the smart-wall-plate system 700 with the PCBA 520 in seated in a wall-plate 540. In the present embodiment, the PCBA 520 shows the left battery mount 522 location and the solder point 524 location on the PCBA 520 for the left battery mount 522 location. The embodiment 1400 also shows the components 630, the SoC 620, the utility opening 234, and the locations of the wall-plate 540 for the snaps 544. Note that the shape of the PCBA 520 provides space for the snaps.

The SoC 620 may include processing circuitry such a processor core, memory circuitry, input/output circuitry such a network interface, and/or the like. In the present embodiment, the SoC 620 may include the wireless communications interface 108 and the PCBA 520 may interconnect the wireless communications interface 108 with the wire antenna 1420 and/or the antenna array in the chip package 1410. The wireless communications interface 108 may include a Wi-Fi interface, Bluetooth interface, a Zigbee interface, a Z-wave interface, and/or other wireless communications interface. For instance, the wireless communications interface 108 may include a directional transceiver coupled with the antenna array and an omni-directional transceiver coupled with the wire antenna 1420. In some embodiments, the PCBA 520 may only include the wire antenna 1420 or the antenna array in the chip package 1410.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

We claim:

1. A wall-plate system, comprising:
   a wall-plate, the wall-plate having a first surface to face away from a wall and an inner surface to face toward the wall, wherein the wall-plate comprises a utility opening, the utility opening to facilitate access to a switch, a display, a touch screen, an outlet, or a combination of one or more thereof;
   a printed circuit board assembly (PCBA) coupled to the inner surface, wherein a user input component mounted on the printed circuit board is arranged and configured to be in contact with the inner surface of the wall-plate, wherein no portion of the PCBA is positioned within the utility opening;

a mounting bracket including two sets of mounting holes, one set of mounting holes to couple the mounting bracket with an in-wall device and one set of mounting holes to couple the mounting bracket with a junction box mounted in the wall;

a chip package mounted to the PCBA, wherein the mounting bracket comprises a cavity to accommodate the chip package; and a battery mount mounted on the PCBA, wherein the mounting bracket comprises a shape to accommodate the battery mount, wherein the battery mount extends into a plane of the mounting bracket.

2. The wall-plate system of claim 1, further comprising a wireless communications interface communicatively coupled with the user input component, the wireless communications interface configured to communicate wirelessly with a remote device.

3. The wall-plate system of claim 1, wherein the user input component comprises a capacitive switch, wherein a light emitting diode (LED) is mounted on the capacitive switch.

4. The wall-plate system of claim 3, wherein the capacitive switch is a first capacitive switch and the PCBA comprises a second capacitive switch proximate to the first capacitive switch, wherein a second light emitting diode (LED) is mounted on the second capacitive switch, the first and second capacitive switches configured to be positioned within first and second gangs, respectively, of a dual-gang wall-plate.

5. The wall-plate system of claim 4, further comprising a light ring, wherein the LED fits in an opening of the light ring, the light ring to diffuse the light from the LED.

6. The wall-plate system of claim 5, further comprising an opaque material between the capacitive switch and the light ring, the opaque material having an opening aligned with the opening of the light ring to allow the LED to pass through the opaque material and into the opening of the light ring to diffuse the light from the LED.

7. The wall-plate system of claim 6, wherein the inner surface of the wall-plate comprises a depression to receive the light ring.

8. The wall-plate system of claim 1, further comprising an integrated circuit mounted in a chip package on the PCBA, the integrated circuit to control a color emitted by a light emitting diode (LED) and control when power is provided to the LED, wherein the integrated circuit comprises a wireless communications interface.

9. The wall-plate system of claim 8, further comprising a shield, wherein the shield comprises plastic to protect one or more of:
the user input component from physical damage;
the chip package from physical damage;
the user input component from electrostatic damage; or
the chip package from electrostatic damage.

10. The wall-plate system of claim 8, further comprising an antenna coupled with the integrated circuit, wherein the antenna comprises a wire or an array of antenna elements in a chip package.

11. The wall-plate system of claim 8, further comprising a factory reset button coupled with the integrated circuit, the factory reset button to reset settings to factory settings, the settings to include a Bluetooth pairing.

12. The wall-plate system of claim 1, further comprising one or more battery mounts coupled with the PCBA, wherein at least one of the one or more battery mounts comprises two hooks to slide onto the PCBA and one solder point.

13. The wall-plate system of claim 1, further comprising:
a capacitive switch coupled with the PCBA and
a shield covering part of the PCBA to protect components coupled with the PCBA from electrostatic damage.

14. The wall-plate system of claim 1, further comprising:
a light emitting diode (LED) coupled with a capacitive switch, the capacitive switch coupled with the PCBA, and
a diffuser having a diffuser opening in the center of the diffuser, wherein the LED is within the diffuser opening.

15. A wall-plate system, comprising:
a mounting bracket;
a wall-plate configured to removably couple to the mounting bracket, the mounting bracket to couple with an in-wall device, a junction box mounted in a wall, or a combination thereof, wherein the wall-plate comprises a utility opening, the utility opening to facilitate access to a switch, a display, a touch screen, an outlet, or a combination of one or more thereof;
a printed circuit board assembly (PCBA) configured to mount to an inner surface of the wall-plate, a first surface of the wall-plate to face away from the wall after installation, wherein no portion of the PCBA is positioned within the utility opening;
a chip package mounted to the PCBA, wherein the mounting bracket comprises one or more cavities to accommodate the chip package; and
a battery mount mounted on the PCBA, wherein the mounting bracket comprises a shape to accommodate the battery mount, wherein the battery mount extends into a plane of the mounting bracket.

16. The wall-plate system of claim 15, further comprising a wireless communications interface communicatively coupled with a user input component, the wireless communications interface configured to communicate wirelessly with a remote device, the wireless communication interface coupled with the PCBA.

17. The wall-plate system of claim 16, wherein the user input component comprises a capacitive switch, wherein a light emitting diode (LED) is mounted on the capacitive switch.

18. The wall-plate system of claim 17, wherein the PCBA comprises a second capacitive switch proximate to the capacitive switch, wherein a second light emitting diode (LED) is mounted on the second capacitive switch, the capacitive switch and the second capacitive switch configured to be positioned within first and second gangs, respectively, of a dual-gang wall-plate.

19. The wall-plate system of claim 18, further comprising a light ring, wherein the LED fits in an opening of the light ring, the light ring to diffuse the light from the LED.

20. The wall-plate system of claim 19, further comprising an opaque material between the capacitive switch and the light ring, the opaque material having an opening aligned with the opening of the light ring to allow the LED to pass through the opaque material and into the opening of the light ring to diffuse the light from the LED.

21. The wall-plate system of claim 19, wherein the inner surface of the wall-plate comprises a depression to receive the light ring.

22. The wall-plate system of claim 21, wherein the capacitive switch couples with an integrated circuit mounted in a chip package mounted on the PCBA.

23. The wall-plate system of claim 15, further comprising an integrated circuit mounted in a chip package on the PCBA, the integrated circuit to control a color emitted by a light emitting diode (LED) and control when power is provided to the LED, wherein the integrated circuit comprises a wireless communications interface.

24. The wall-plate system of claim 23, further comprising a shield, wherein the shield comprises plastic to protect one or more of:
 a user input component from physical damage;
 the chip package from physical damage;
 the user input component from electrostatic damage; or
 the chip package from electrostatic damage.

25. The wall-plate system of claim 23, further comprising an antenna coupled with the integrated circuit, wherein the antenna comprises a wire or an array of antenna elements in a chip package.

26. The wall-plate system of claim 23, further comprising a factory reset button coupled with the integrated circuit, the factory reset button to reset settings to factory settings, the settings to include a Bluetooth pairing.

27. The wall-plate system of claim 15, further comprising one or more battery mounts coupled with the PCBA, wherein at least one of the one or more battery mounts comprises two hooks to slide onto the PCBA and one solder point.

28. The wall-plate system of claim 15, further comprising:
 a capacitive switch coupled with the PCBA and
 a shield covering part of the PCBA to protect components coupled with the PCBA from electrostatic damage.

29. The wall-plate system of claim 15, further comprising:
 a light emitting diode (LED) coupled with a capacitive switch, the capacitive switch coupled with the PCBA, and
 a diffuser having a diffuser opening in the center of the diffuser, wherein the LED is within the diffuser opening.

* * * * *